US012749976B2

(12) United States Patent
Li et al.

(10) Patent No.: US 12,749,976 B2
(45) Date of Patent: Sep. 29, 2026

(54) SWITCH CONVERTER

(71) Applicants: Joulwatt Technology Co., Ltd., Hangzhou (CN); Joulwatt Technology (Shanghai) Co., Ltd., Shanghai (CN)

(72) Inventors: Linjue Li, Shanghai (CN); Haitao Wen, Hangzhou (CN); Pitleong Wong, Hangzhou (CN)

(73) Assignees: Joulwatt Technology Co., Ltd., Hangzhou (CN); Joulwatt Technology (Shanghai) Co., Ltd., Shanghai (CN)

( * ) Notice: Subject to any disclaimer, the term of this patent is extended or adjusted under 35 U.S.C. 154(b) by 165 days.

(21) Appl. No.: 18/799,670

(22) Filed: Aug. 9, 2024

(65) Prior Publication Data

US 2025/0062692 A1 Feb. 20, 2025

(30) Foreign Application Priority Data

Aug. 18, 2023 (CN) ......................... 202311049013.3
Aug. 18, 2023 (CN) ......................... 202311056818.0

(51) Int. Cl.
*H02M 3/158* (2006.01)
*H02M 1/00* (2007.01)
*H03K 17/687* (2006.01)

(52) U.S. Cl.
CPC ......... *H02M 3/158* (2013.01); *H02M 1/0009* (2021.05); *H03K 17/687* (2013.01)

(58) Field of Classification Search
CPC ... H02M 1/0009; H02M 3/158; H02M 3/1582
See application file for complete search history.

(56) References Cited

U.S. PATENT DOCUMENTS 10,254,314 B1 * 4/2019 Li ........................ H02M 3/1582
2024/0250613 A1 * 7/2024 McCue ............... H02M 1/0009

FOREIGN PATENT DOCUMENTS

CN 115441737 A 12/2022

* cited by examiner

*Primary Examiner* — Ryan Johnson
(74) *Attorney, Agent, or Firm* — IPro, PLLC

(57) ABSTRACT

The present application discloses a switch converter, and the switch converter comprises a first switch transistor, a second switch transistor, and an inductor, and further comprises: an acquisition unit for acquiring voltage of at least one end of the inductor, to obtain a first sampling signal and a second sampling signal; an operation unit, to obtain a current sampling signal based on the first sampling signal and the second sampling signal. The current sampling method in the switch converter of the present disclosure is simple, not easily affected by noise interference, and it has low requirements for devices, and adapts to different converters.

20 Claims, 14 Drawing Sheets

- Prior Art -

SWITCH CONVERTER

CROSS-REFERENCE TO RELATED APPLICATIONS

This present disclosure claims priority to a Chinese patent application No. 2023110568180, filed on Aug. 18, 2023, and entitled "current detection circuit, detection method and switching circuit of H-bridge circuit", and further claims priority to a Chinese patent application No. 2023110490133, filed on Aug. 18, 2023, and entitled "current sampling circuit and current sampling method of converter and converter", the entire contents of which are incorporated herein by reference, including the specification, claims, drawings and abstract.

FIELD OF TECHNOLOGY

The present disclosure relates to the field of power electronics, particularly, to a switch converter.

BACKGROUND

In the application scenarios of switch converters like wireless charging, it is necessary to monitor the average current of the switch converter in real time to achieve normal operation of the system and fast fault protection function. The current mainstream solution is to use high-precision sampling resistors Rcs to realize high-precision current sampling, so as to implement various control and protection functions. However, the solution of external sampling resistors increases material costs and makes PCB layout more difficult, reducing product efficiency while increasing system design complexity, and thus it will reduce the overall product yield and increase the operating cost of the entire product.

In addition, in prior art, the inductor current is sampled through current mirroring, as shown in FIG. 1, it shows a conventional circuit structure diagram of the current sampling circuit of the converter. The power conversion circuit 10 (BUCK topology) comprises a main first switch transistor Q1 and a synchronous second switch transistor Q2 connected in series. The connection node between the two is SW, and an inductor L is connected between the node and the output terminal. The current flowing through the inductor is inductor current IL. There is also a capacitor Co and a load resistor Ro connected between the output terminal and the ground. The main first switch transistor Q1 receives the first switch control signal Vg1, while the synchronous second switch transistor Q2 receives the second switch control signal Vg2.

The traditional current sampling circuit 20 comprises transistors Q1 and Q2 connected between the input terminal and the ground, with SW0 being the connection node between the transistor Q1 and Q2. The length of transistor Q1 is the same as that of the main first switch transistor Q1, but its width is 1/K the width of the main first switch transistor Q1. The control terminal of transistor Q1 receives the first switch control signal Vg1. The positive input terminal and the reverse input terminal of the operational amplifier OP are connected to node SW and node SW0 respectively, and the output terminal is connected to the control terminal of transistor Q2. The operational amplifier OP samples and compares the drains of transistor Q1 and the main first switch transistor Q1 respectively, and feeds the results back to the gate of transistor Q2 to clamp the drain potentials of the main first switch transistor Q1 and transistor Q1 to be equal, i.e., stable, and voltage of the two input terminals of the operational amplifier OP is equal, and the current corresponding mirrors of the main first switch transistor Q1 and transistor Q1 are in proportion, and the current flowing through transistor Q1 is equal to 1/K of the current flowing through the first switch transistor Q1. Moreover, the current of transistor Q1 flows through the sampling resistor Rs between transistor Q2 and the ground, and the sampled current signal is converted into voltage signal to get the current sampling signal Vsense. Such sampling manner has low sampling accuracy and great power consumption when the current is small. Moreover, it can sample the current only when the main switch transistor is turned on, and the sampling time is limited; the operational amplifier OP needs to make the voltage at two input terminals be the same and stable within short time, which puts high requirements on the operation amplifier, and the sampling is also easily affected by switch noise.

SUMMARY

The objective of the present disclosure is to provide a highly efficient, simple and low-cost switch converter to realize current sampling, so as to solve the technical problem in the prior art that the sampling accuracy is not high and the power consumption is great.

To implement the above objectives, the present disclosure provides a switch converter, comprising a first switch transistor, a second switch transistor, and an inductor, and further comprises:

- an acquisition unit for acquiring voltage of at least one end of the inductor, to obtain a first sampling signal and a second sampling signal;
- an operation unit, to perform operations on the first sampling signal and the second sampling signal to obtain a current sampling signal;
- a control circuit, to receive the current sampling signal for controlling the switching status of the first switch transistor and second switch transistor.

Optionally, it further comprises: a third switch transistor and a fourth switch transistor which are connected; under the first switching status, the first switch transistor and the third switch transistor are turned on synchronously, and the second switch transistor and the fourth switch transistor are turned off synchronously; under the second switching status, the second switch transistor and the fourth switch transistor are turned on synchronously, and the first switch transistor and the third switch transistor are turned off synchronously.

Optionally, the current sampling signal denotes an average value of the inductor current, and one end of the inductor is connected to a common connection terminal of the first switch transistor and the second switch transistor, and the other end of the inductor is the input end or the output end of the switch transistor.

Optionally, the acquisition unit comprises:

- a first acquisition unit for acquiring the voltage of one end of the inductor, to obtain the first sampling signal;
- a second acquisition unit for acquiring the voltage of the second node between the third switch transistor and the fourth switch transistor, to obtain the second sampling signal denoting an average value of the voltage of the second node.

Optionally, one end of the inductor which is directly connected to the output end or the input end of the switch converter is the first end of the inductor, and the first acquisition unit acquires the first sampling signal from the first terminal of the inductor.

Optionally, one end of the inductor which is connected to the first node between the first switch transistor and the second switch transistor is a second end of the inductor, the first acquisition unit is connected to the second end of the inductor for acquiring the voltage on the first node, to obtain the first sampling signal denoting the average value of the voltage of the first node.

Optionally, the operation unit comprises an error amplifier, and the error amplifier receives the first sampling signal and the second sampling signal, to output the current sampling signal, and an amplifying coefficient of the error amplifier is K, K being a positive number.

Optionally, the first acquisition unit and the second acquisition unit comprise a first filter and a second filter respectively; the first filter filters the volage of the first node to obtain the first sampling signal, and the second filter filters voltage of the second node to obtain the second sampling signal.

Optionally, the switch converter is a multi-phase switch converter, and each phase of switch converter comprises the first switch transistor, the second switch transistor, and the inductor, and each phase of switch converter obtains the current sampling signal, and the multi-phase converter obtains correspondingly multiple current sampling signals; further comprising, a current averaging circuit, to obtain an average current signal based on the multiple current sampling signals;

a current correction circuit, to obtain the inductance current correction signal of each phase of switch converter based on the current sampling signal of each phase of switch converter; and a driving signal regulating circuit, to regulate a duty cycle of the driving signal of each phase of switch converter based on the inductance current correction signal of each phase of switch converter; the driving signal is used to control the first switch transistor and second switch transistor of each phase of switch converter to turn on and off.

Optionally, the current correction unit comprises multiple current correction units, and each current correction unit comprises an operation amplifier to obtain the inductor current correction signal according to the current sampling signal and the average current signal.

Optionally, the current sampling signal denotes the average value of the input current of the switch converter; a first node between the first switch transistor and the second switch transistor is connected to one end of the inductor, and the second node between the third switch transistor and the fourth switch transistor is connected to another end of the inductor.

Optionally, the acquisition unit comprises:

a first acquisition unit for acquiring the voltage of the first node or the second node under the first switching status, to obtain a first sampling signal denoting the voltage average value of the corresponding node;

a second acquisition unit for acquiring the voltage of the first node or the second node under the second switching status, to obtain a second sampling signal denoting the voltage average value of the corresponding node.

wherein the first switch transistor and the second switch transistor are turned on simultaneously under the first switching status, and the second switch transistor and the fourth switch transistor are turned on simultaneously under the second switching status.

Optionally, the first sampling signal denotes an average value of the input current under the first switching status; the second sampling signal denotes the average value of the input current under the second switching status.

Optionally, the first acquisition unit acquires the voltage of the first node under the first switching status to obtain the first sampling signal, the second acquisition unit acquires the voltage of the second node under the second switching status to obtain the second sampling signal;

the operation unit calculates two times the difference between the input voltage of the switch converter and the sum of the first sampling signal and the second sampling signal to obtain the current sampling signal.

Optionally, the first acquisition unit acquires the voltage of the second node under the first switching status to acquire the first sampling signal;

the second acquisition unit acquires the voltage of the second node under the second switching status to acquire the second sampling signal;

the operation unit calculates the difference between the input voltage of the switch converter and the second sampling signal, and obtains the current sampling signal according to the sum of the difference and the first sampling signal.

Optionally, the first acquisition unit acquires the voltage of the first node under the first switching status to obtain the first sampling signal, the second acquisition unit acquires the voltage of the second node under the second switching status to obtain the second sampling signal;

the operation unit calculates the difference between double the input voltage of the switch converter and the sum of the first sampling signal and the second sampling signal to obtain the current sampling signal.

Optionally, the first acquisition unit acquires the voltage of the second node under the first switching status to acquire the first sampling signal;

the second acquisition unit acquires the voltage of the first node under the second switching status to acquire the second sampling signal;

the operation unit calculates the sum of the first sampling signal and the second sampling signal to obtain the current sampling signal.

Optionally, the first acquisition unit comprises a first sampling transistor, a second sampling transistor, and a first filtering circuit;

a first terminal of the first sampling transistor is connected to the first node, and a second terminal of the first sampling transistor is connected to the first terminal of the first filtering circuit, and the second terminal of the first filter is connected to the reference ground;

the first filtering circuit generates the first sampling signal, and the second sampling transistor is connected between the first terminal of the first filtering circuit and the input terminal of the switch converter;

the first sampling transistor is turned on under the first switching status, and the second sampling transistor is turned on in complementary with the first sampling transistor.

Optionally, the first acquisition unit comprises a first sampling transistor, a second sampling transistor, and a first filtering transistor, a first terminal of the first sampling transistor is connected to the second node, the second terminal of the first sampling transistor is connected to the first terminal of the first filtering circuit, and the second terminal of the first filtering circuit is connected to the reference ground;

the first filtering circuit generates the first sampling signal, and the second sampling transistor is connected in parallel with the first filtering circuit;

the first sampling transistor is turned on under the first switching status, and the second sampling transistor is turned on in complementary with the first switch transistor.

Optionally, the second acquisition unit comprises a third sampling transistor, a fourth sampling transistor, and a second filtering circuit, a first terminal of the third sampling transistor is connected to the first node, and the second terminal of the third sampling transistor is connected to the first terminal of the second filtering circuit, and the second terminal of the second filtering circuit is connected to the reference ground;

the second filtering circuit generates the second sampling signal, and the fourth sampling transistor is connected in parallel with the second filtering circuit;

the third sampling transistor is turned on under the second switching status, and the fourth sampling transistor is turned on in complementary with the third switch transistor.

Optionally, the second acquisition unit comprises a third sampling transistor, a fourth sampling transistor, and a second filtering circuit, the first terminal of the third sampling transistor is connected to the second node, and the second terminal of the third sampling transistor is connected to the first terminal of the second filtering circuit, and the second terminal of the second filtering circuit is connected to the reference ground;

the second filtering circuit generates the second sampling signal, and the fourth sampling transistor is connected between the first terminal of the second filtering circuit and the input terminal of the switch converter;

the third sampling transistor is turned on under the second switch transistor, and the fourth sampling transistor is turned on in complementary with the third switch transistor.

Compared with the prior art, the present disclosure does not need to place high-precision sampling resistor in the switch converter to perform current sampling, so as to avoid resistor virtual soldering, short circuits, open circuits, poor accuracy brought by the sampling resistor and low reliability issues brought by burnout, and the structure is simple and easy to implement, which saves cost, reduces system design complexity, and has high reliability. The entire current sampling circuit has simple structures and is easy to implement, and highly accurate sampling result which is in linear relationship with the current can be obtained merely by the simple circuit structure.

BRIEF DESCRIPTION OF THE DRAWINGS

Through the following description of the embodiments of the present disclosure with reference to the accompanying drawings, the above and other objectives, features, and advantages of the present disclosure will be more apparent, in the accompanying drawings.

DETAILED DESCRIPTION

The following will describe the preferred embodiments of the present disclosure in great details by combining with the accompanying drawings. However, the present disclosure is not restricted to these embodiments. The present disclosure convers any replacement, modifications, equivalent methods, and solutions made within the sprits and scope of the present disclosure.

In order to make the public have a thorough understanding, specific details are described in the following preferred embodiments of the present disclosure; however, those skilled in the art can totally understand the present disclosure without these detailed descriptions. s The present disclosure is described in great details in the following paragraphs by referring to the accompanying drawings. It should be noted that the accompanying drawings all use simplified forms and use non-accurate sales, just for the purpose of conveniently and clearly illustrate the embodiments of the present disclosure.

Figure 1:
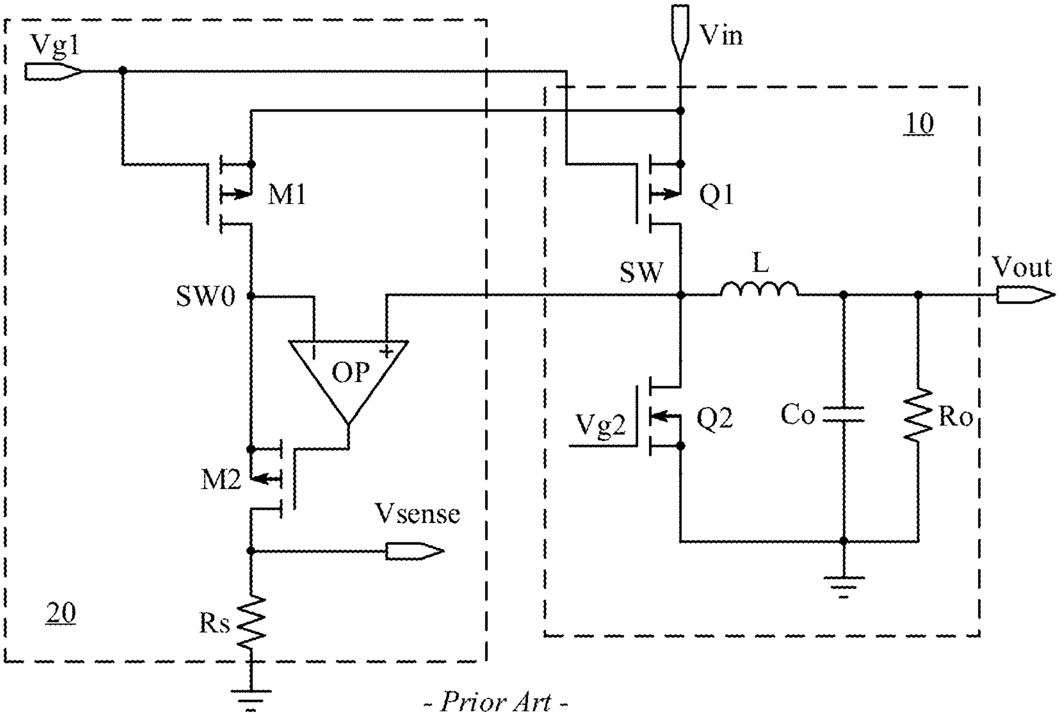
FIG. 1 is a current sampling circuit principle diagram of the prior art switch converter.
Figure 2:
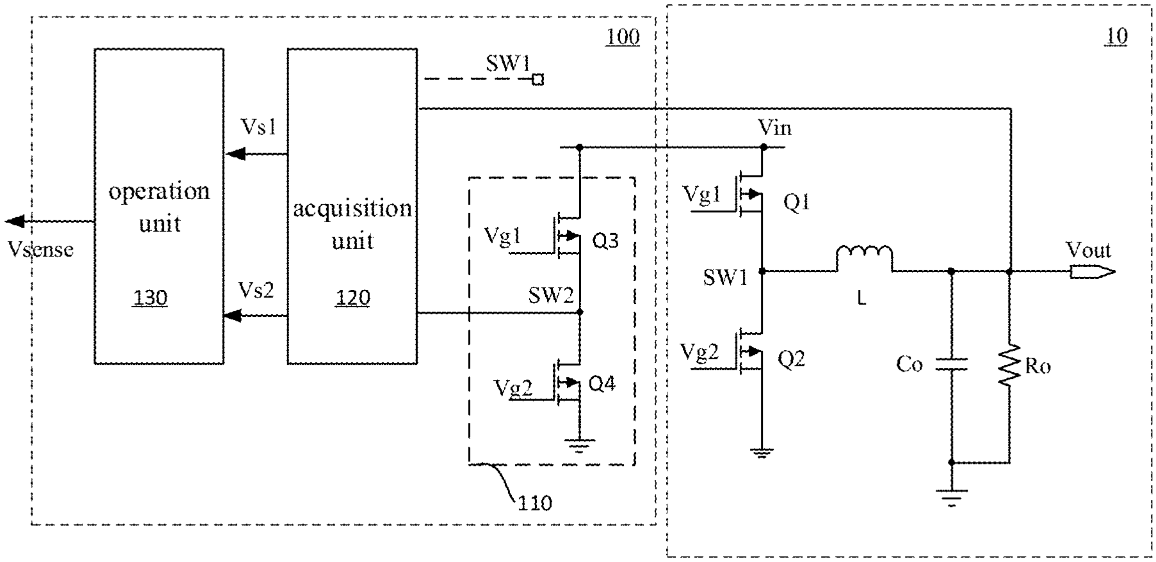
FIG. 2 is a block diagram of the first switch converter of the present disclosure.

As shown in FIG. 2, it shows a principle diagram of the first switch converter of the present disclosure. The switch converter is a buck converter, comprising a power conversion circuit 10 and a current sampling circuit 100. The power conversion circuit 10 comprises a first switch transistor Q1 and a second switch transistor Q2 which are connected to each other. The intermediate node between the first switch transistor Q1 and the second switch transistor Q2 is the first node SW1, and one end of the inductor L is connected to the first node SW1, while the other end is connected to the output capacitor Co. The current sampling circuit 100 comprises a synchronization unit 110, an acquisition unit 120, and an operation unit 130. The synchronization unit 110 comprises a third switch transistor Q3 and a fourth switch transistor Q4 which are connected to each other. The third switch transistor Q3 and the fourth switch transistor Q4 are two sampling transistors, which can be regarded as the first sampling transistor and the second sampling transistor respectively, or the fourth switching transistor Q4 and the third switching transistor Q3 can be regarded as the first sampling transistor and the second sampling transistor respectively. In FIG. 2, the third switch transistor Q3 and the fourth switch transistor Q4 are used as examples of the first sampling transistor and the second sampling transistor, respectively, and a sampling path is formed through the two sampling transistors connected between the input terminal and the ground terminal. In other embodiments, the third switch transistor Q3 and the fourth switch transistor Q4 can also be connected in series between the output terminal and the ground terminal. The acquisition unit 120 is connected to the synchronization unit 110, and the second sampling signal Vs2 denoting the average voltage of the second node is obtained from the second node SW2 between the third switching transistor Q3 and the fourth switching transistor Q4. The operation unit 130 is connected to the acquisition unit 120, and the current sampling signal Vsense is obtained based on the second sampling signal Vs2 and the first sampling signal Vs1 obtained from the voltage at one end of the inductor L, which represents the average value of the inductor current IL of the converter. Specifically, there is a linear relationship between the current sampling signal Vsense and the average inductance current IL of the power conversion circuit 10, or the current sampling signal Vsense varies linearly with the average inductance current IL of the power conversion circuit 10.

The end of inductor L directly connected to the output end or the input end is defined as the first end of inductor L, and the end of inductor L connected to the first node SW1 between the first switch transistor Q1 and the second switch transistor Q2 is the second end of inductor L. In this embodiment, the power conversion circuit 10 is a BUCK topology, and thus the one end of inductor L directly connected to the output end of the converter is the first end, and the other end is the second end. When the operation unit 130 is directly connected to the first end of inductor L, the first sampling signal Vs1 is obtained according to the voltage of the first end of inductor L. Further, when the operation unit 130 is connected to the second end of inductor L, i.e., the first node SW1, the acquisition unit 120 acquires the voltage on the first node SW1, to obtain the first sampling signal Vs1 denoting the average value of the voltage of the first node SW1.

Further, the operation unit 130 performs amplification process on the difference of the first sampling signal Vs1 and the second sampling signal Vs2 and outputs it as the current sampling signal Vsense, i.e., the difference between the first sampling signal Vs1 and the second sampling signal Vs2 can be amplified by certain times, and the certain times may be one time or multiple times. Then, the operation unit 130 may comprise an error amplifier EA1, and the error amplifier EA1 receives the first sampling signal Vs1 and the second sampling signal Vs2, and outputs the current sampling signal Vsense. The amplification coefficient of the error amplifier EA1 is K, which is a positive number; in the above mentioned method, the certain times may be K times. The finally obtained current sampling signal Vsense may linearly vary with the inductor current IL, and the change of the inductor current can be checked directly according to the sampled current sampling signal, and the sampling accuracy of the small current is very high, and the power consumption is small, which expands the application scope of the current sampling circuit.

Figure 3:
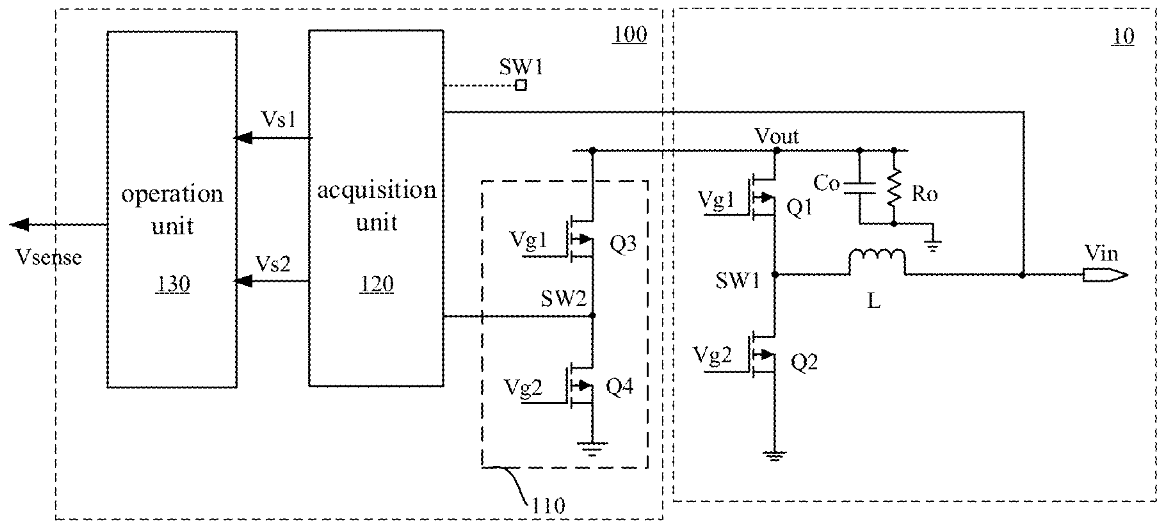
FIG. 3 is a block diagram of the second switch converter of the present disclosure.

As shown in FIG. 3, it shows a principle diagram of the second kind of switch converter of the present disclosure; the switch converter is a boost converter, comprising a power conversion circuit 10 and a current sampling circuit 100. The power conversion circuit 10 comprises a first switch transistor Q1 and a second switch transistor Q2 connected to each other. The middle node between the first switch transistor Q1 and the second switch transistor Q2 is the first node SW1. One end of inductor L is connected to the first node SW1, and the other end is connected to the receiving input voltage Vin. The first end of the first switch transistor Q1 is connected to the output capacitor Co. For the working principle of the current sampling circuit 100, refer to the explanation of the current sampling circuit 100 in FIG. 2, which is not further elaborated here.

The control circuit of the switch converter illustrated in FIGS. 2 and 3 (not shown) controls the switching status of the first switch transistor Q1, the second switch transistor Q2, the third switch transistor Q3, and the fourth switch transistor Q4 based on the current sampling signal Vsense. The first switch transistor Q1 and the third switch transistor Q3 are turned on and off synchronously, while the second switch transistor Q2 and the fourth switch transistor Q4 are turned on and off synchronously; under the first switching status, the first switch transistor Q1 and the third switch transistor Q3 are turned on, while the second switch transistor Q2 and the fourth switch transistor Q4 are turned off; under the second switching status, the first switch transistor Q1 and the third switch transistor Q3 are turned off, and the second switch transistor Q2 and the fourth switch transistor Q4 are turned on.

Figure 4:
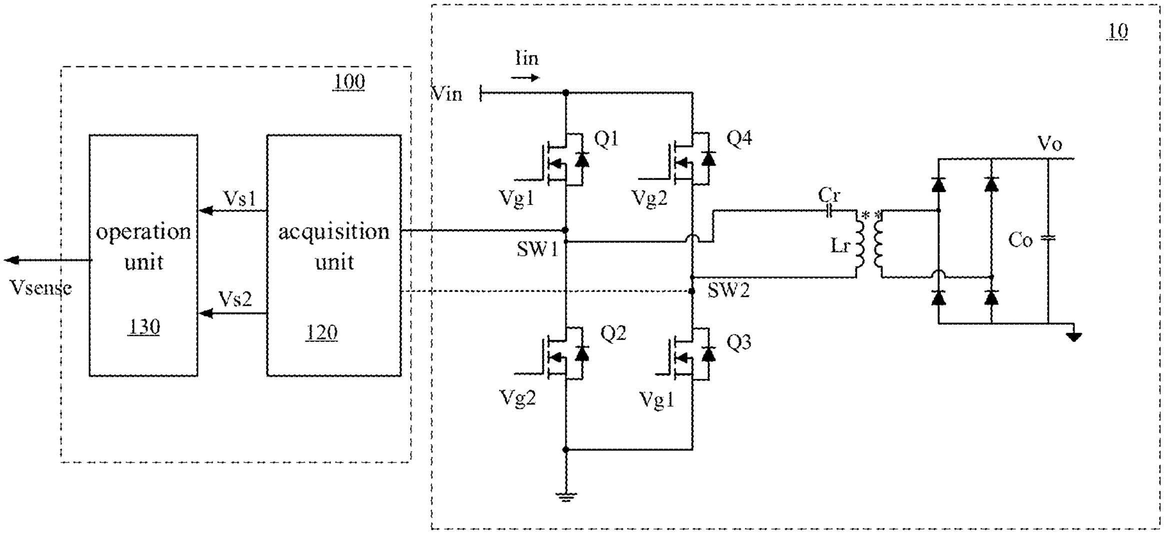
FIG. 4 is a block diagram of the third switch converter of the present disclosure.

As shown in FIG. 4, it shows a principle diagram of a third kind of switch converter of the present disclosure. The switch converter is an H-bridge converter, including an H-bridge power conversion circuit 10 and a current sampling circuit 100. The power conversion circuit 10 comprises a first bridge arm connected by a first switch transistor Q1 and a second switch transistor Q2. The connection end between the first switch transistor Q1 and the second switch transistor Q2 is the first node SW1, and the first switch transistor Q1 is the upper transistor of the first bridge arm, while the second switch transistor Q2 is the lower transistor of the first bridge arm; it also comprises a second bridge arm connected by a third switch transistor Q3 and a fourth switch transistor Q4; the connection end of the third switch transistor Q3 and the fourth switch transistor Q4 is the second node SW2; the fourth switch transistor Q4 is the upper transistor of the second bridge arm, while the third switch transistor Q3 is the lower transistor of the second bridge arm. That is, the first switch transistor Q1 and the fourth switch transistor Q4 are the upper transistors of the H-bridge converter, while the second switch transistor Q2 and the third switch transistor Q3 are the lower transistors of the H-bridge converter; in the H-bridge converter of the present disclosure, the first end of the first bridge arm and the the first end of the second bridge arm receive an input voltage Vin, and the second end of the first bridge and the second end of the second bridge arm are connected to a reference ground, and an inductor Lr is also connected between the first node SW1 and the second node SW2; furthermore, it comprises the H-bridge converter, a resonant circuit, and a rectifier circuit. The resonant circuit is connected between the intermediate node of the first bridge arm and the intermediate node of the second bridge arm of the H-bridge converter. The resonant circuit comprises a resonant capacitor Cr and a resonant inductor Lr, which can be the primary winding of the transformer; further, the intermediate node SW1 of the first bridge arm of the H-bridge converter and the intermediate node SW2 of the second bridge arm can also be directly connected to the load, such as a motor, and its inductance current iL waveform will also change accordingly; the output end of the switch circuit is connected to the rectifier circuit to obtain the rectified output voltage. The present disclosure does not limit the specific form of input and output of the H-bridge converter.

In the first control mode of the H-bridge converter, the first control signal Vg1 and the second control signal Vg2 are complementary with each other, that is, the switching status of the first switch transistor Q1 and the third switch transistor Q3 are the same, and the switching status of the second switch transistor Q2 and the fourth switch transistor Q4 are the same, including the first switching status where the first switch transistor Q1 and the third switch transistor Q3 are turned on, and the second switching status where the second switch transistor Q2 and the fourth switch transistor Q4 are turned on, and the inductance current increases when the first switch transistor Q1 and the third switch transistor Q3 are turned on; when the fourth switch transistor Q4 and the second switch transistor Q2 are turned on, the inductance current decreases; in the second control mode, the first control signal Vg1 and the second control signal Vg2 are out of phase and not complementary with each other, and there are following four consecutive statuses: the first switching status where the first switch transistor Q1 and the third switch transistor Q3 are turned on, the third switching status where the first switch transistor Q1 and the fourth switch transistor Q4 are turned on; energy circulates in the loop where the first switch transistor Q1, the fourth switch transistor Q4, the inductor Lr, and the capacitor Cr are located; the second switching status where the second switch transistor Q2 and the fourth switch transistor Q4 are turned on, and the fourth switching status where the second switch transistor Q2 and the fourth switch transistor Q4 are turned on, and energy circulates in the loop where the second switch transistor Q2, the third switch transistor Q3, inductor Lr, and capacitor Cr are located. According to the above analysis, the H-bridge converter comprises a first switching status and a second switching status; Optionally, it also comprises the third switching status and the fourth switching status.

In the H-bridge converter, the conduction resistances of the first switch transistor Q1 to the fourth switch transistor Q4 are $R_{Q1}$~$R_{Q4}$, respectively. Generally, the types and sizes of the four switch transistors are the same, assume the conduction resistance is a fixed value $R_Q$; assume the input current is I1 in the first switching status and I2 in the second switching status. The current sampling circuit 100 of the present disclosure comprises an acquisition unit 120 and an operation unit 130. The acquisition unit 120 acquires a signal containing the information of input current I1 to obtain the first sampling signal Vs1, and the acquisition unit 120 acquires a signal containing the information of input current I2 to obtain the second sampling signal Vs2; the operation unit 130 obtains a current sampling signal Vsense denoting the average input current Iin according to the first sampling signal Vs1 and the second sampling signal Vs2. The control circuit of the H-bridge converter (not shown in the figure) controls the switching status of the first switch transistor Q1, the second switch transistor Q2, the third switch transistor Q3, and the fourth switch transistor Q4 based on the current sampling signal Vsense.

Figure 5:
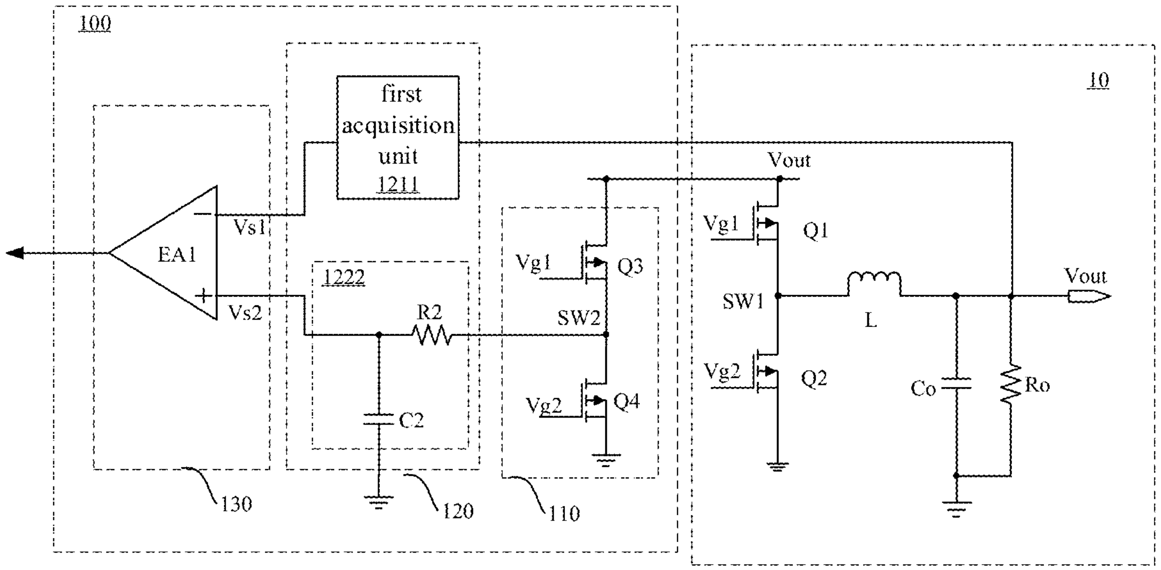
FIG. 5 is a principle diagram of embodiment 1 of the first switch converter of the present disclosure.

As shown in FIG. 5, it shows a principle diagram of embodiment 1 of the first kind of switch converter of the present disclosure. The power conversion circuit 10 is of a buck circuit structure, e.g., the same as the power conversion circuit 10 in FIG. 2. The power conversion circuit 10 comprises a first switch transistor Q1 and a second switch transistor Q2 connected in series between the input terminal and ground terminal. The working principle of the power conversion circuit 10 is not explained in detail here. The connection node between the first switch transistor Q1 and the second switch transistor Q2 is the first node SW1, and an inductor L is connected between node SW1 and the output terminal, and the current flowing through the inductor is inductor current IL. There is also a capacitor Co connected between the output terminal and the ground terminal, and the load resistor Ro is connected in parallel at both ends of the capacitor Co. The input terminal receives the input voltage Vin, and the output terminal generates the output voltage Vout. The first switch transistor Q1 and the second switch transistor Q2 control the transmission of electrical energy between the input and output terminals to convert the input voltage Vin into the output voltage Vout. The gates of the first switch transistor Q1 and the second switch transistor Q2 are connected to the control circuit, and the conduction of the two switch transistors is controlled by the control circuit. The conduction states of the two switch transistors are complementary to each other. Here, the control circuit receives a current sampling signal representing the average value of the inductance current, which is used to control the switching status of the first and second switch transistors. For example, the first switch transistor Q1 receives the first switch control signal Vg1, and the second switch transistor Q2 receives the second switch control signal Vg2. The first switch transistor Q1 and the second switch transistor Q2 can both be either NMOS or PMOS. Here, explanation will be made by taking the example that both the first switch transistor Q1 and the second switch transistor Q2 are NMOS transistors.

In this embodiment, the first sampling transistor Q3 and the first switch transistor Q1 of the synchronization unit 110 of the current sampling circuit 100 receive the same first switch control signal Vg1, to turn on and turn off synchronously; the second sampling transistor Q4 and the second switch transistor Q2 receive the same second switch control signal Vg2, to turn on and turn off synchronously. The two sampling transistors of the synchronization unit 110 actually receive the same switch control signal as the two switch transistors of the power conversion circuit 10. The acquisition unit 120 includes a first acquisition unit 121 and a second acquisition unit 122. The first acquisition unit 121 directly acquires the voltage at the first end of the inductor L, which is the output voltage Vout, to obtain the first sampling signal Vs1. The average voltage of the first node SW1 can be equivalent to the output voltage Vout. The second acquisition unit 122 performs signal processing on the voltage of the second node SW2 to obtain the second sampling signal Vs2, which denotes the average value of the voltage of the second node SW2. The signal processing here can include filtering processing, that is, the second acquisition unit 122 can include a filter for filtering the voltage of the second node SW2 to obtain the second sampling signal Vs2, which includes a resistor R2 and a capacitor C2 connected between the second node SW2 and the ground, and outputs the second sampling signal Vs2.

Furthermore, the operation unit 130 amplifies the difference between the second sampling signal Vs2 and the first sampling signal Vs1 to output the inductor current sampling signal Vsense. The difference is amplified by a certain number of multiples, which can be one or more multiples, integer multiples or decimal multiples. For example, if the certain amplification is once, the operation unit 130 may be a subtractor. The operation unit 130 may also include an error amplifier EA1, where a certain amplification is the amplification factor of the error amplifier EA1. For example, the reverse input of the error amplifier EA1 receives the first sampled signal Vs1, the positive input terminal of the error amplifier EA1 connects the intermediate node of resistor R2 and capacitor C2 to receive the second sampling signal Vs2. After flowing through the error amplifier EA1, the output inductance current sampling signal Vsense linearly changes with the average value of inductance current IL, that is, the inductance current sampling signal Vsense denotes the average value of inductance current IL.

Figure 6:
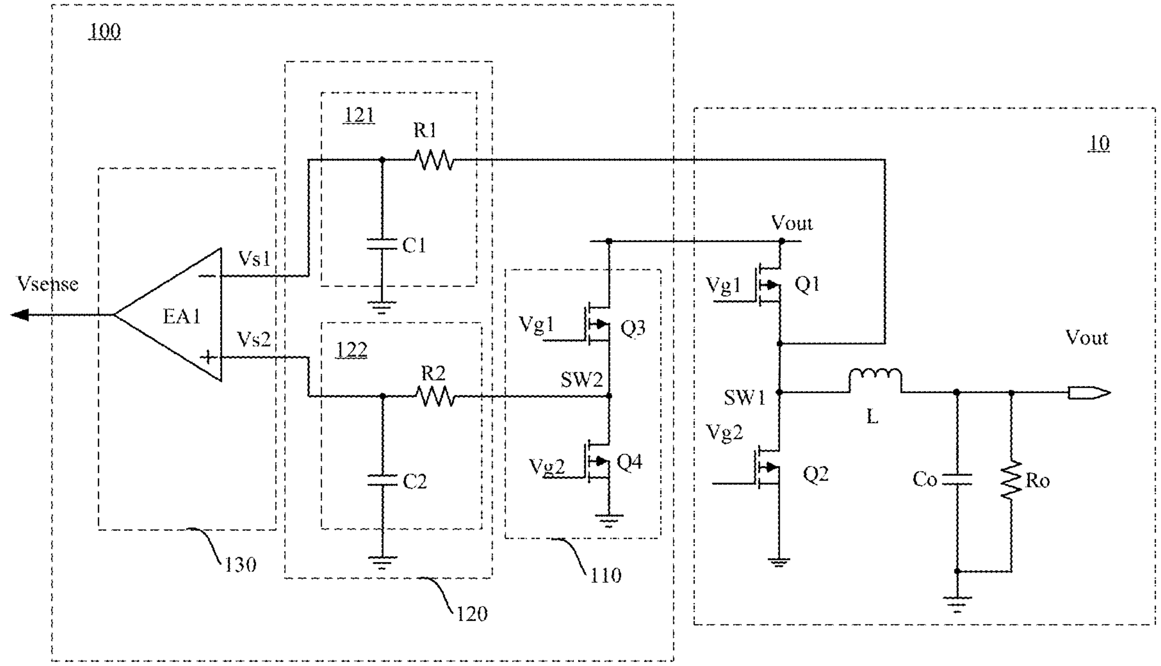
FIG. 6 is a principle diagram of embodiment 2 of the first switch converter of the present disclosure.

As shown in FIG. 6, it shows a principle diagram of embodiment 2 of the first switch converter of the present disclosure, which is another implementation method of FIG. 2, as well as also a preferred embodiment of FIG. 5. The power conversion circuit 10 in FIG. 6 is totally identical to the power conversion circuit 10 in the embodiment of FIG. 2, and will not be repeated here. In this embodiment, the current sampling circuit 100 also includes a synchronization unit 110, an acquisition unit 120, and an operation unit 130. The circuit connections and structures of the synchronization unit 110, the first acquisition unit 120, and the operation unit 120 are the same as those in the embodiment of FIG. 5, and will not be repeated. Compared with the embodiment of FIG. 5, this embodiment differs in that the signals acquired and processed by the first acquisition unit are different. In this embodiment, the first acquisition unit 121 is connected between the second end of the inductor L and the operation unit 130. The first acquisition unit 121 acquires the average voltage on the first node SW1 to obtain the first sampling signal Vs1. Specifically, the first acquisition unit 121 can be the same as the second acquisition unit 122, for example, filtering the voltage of the first node SW1 to obtain the first sampling signal Vs1. That is, the first acquisition unit 110 may comprise a first filter, which includes a resistor R1 and a capacitor C1 connected between the first node SW1 and the ground. The voltage on the first node SW1 is filtered to obtain the average voltage of the first node, and the output is the first sampling signal Vs1.

Take the above structure as an example, when the current sampling circuit 100 is operating, the third switch transistor Q3 and the first switch transistor Q1 (main switch transistor) are simultaneously controlled by the first switch control signal Vg1, while the second sampling transistor Q4 and the second switch transistor Q2 (synchronous switch transistor) are simultaneously controlled by the second switch control signal Vg2. The first switch control signal controls Vg1 and the second switch control signal Vg2, as driving signals, are both controlled by PWM signals output by the control circuit (not shown) of the power conversion circuit 10. Generally, PWM signals make the conduction states of the first switch transistor Q1 and the second switch transistor Q2 be complementary, and the ratio of the conduction time of the first switch transistor Q1 to the switching cycle is the duty cycle D. Then, when the first switch transistor Q1 is turned on and the second switch transistor Q2 is turned off, the inductor current flows through the first switch transistor Q1. At this time, the voltage $V_{SW1}$ of the first node SW1 is: $V_{SW1}=Vin-I_{L1}\times R_{Q1}$, where $I_{L1}$ is the inductor current and $R_{Q1}$ is the conduction resistance of the first switch transistor Q1. When the first switch transistor Q1 is turned off and the second switch transistor Q2 is turned on, the inductor current flows through the second switch transistor Q2. At this time, the voltage $V_{SW1}$ of the first node SW1 is: $V_{SW1}=-I_{L1}\times R_{Q2}$, where $R_{Q2}$ is the conduction resistance of Q2. The voltage on the first node SW1 is filtered to obtain its average value Vavg1, $Vavg1=Vin\times D-I_{L1}\times[R_{Q1}\times D+R_{Q2}\times(1-D)]$. Due to the very large filtering resistor R2, which is much greater than the conduction resistance of switch transistor Q3 or Q4, and the balanced charging and discharging of capacitors, the current flowing through switch transistor Q3 and switch transistor Q4 can be ignored, and it can be considered that the average current flowing through switch transistor Q3 and switch transistor Q4 is equal to 0. So, the average voltage value Vsw2 on the second node SW2 is: $V_{SW2}=Vin\times D$. After being processed by the error amplifier EA1, the inductor current sampling signal Vsense, i.e., the voltage output by the error amplifier EA1, is $Vsense=K\times I_{L1}\times[R_{Q1}\times D+R_{Q2}\times(1-D)]$. K can be the amplification factor of the error amplifier, and is a positive number. In power conversion circuit 10, $R_{Q1}$ and $R_{Q2}$ are both definite values. Therefore, under the same input voltage and output voltage, the inductor current sampling signal Vsense varies linearly with the average value of the inductor current.

Figure 7:
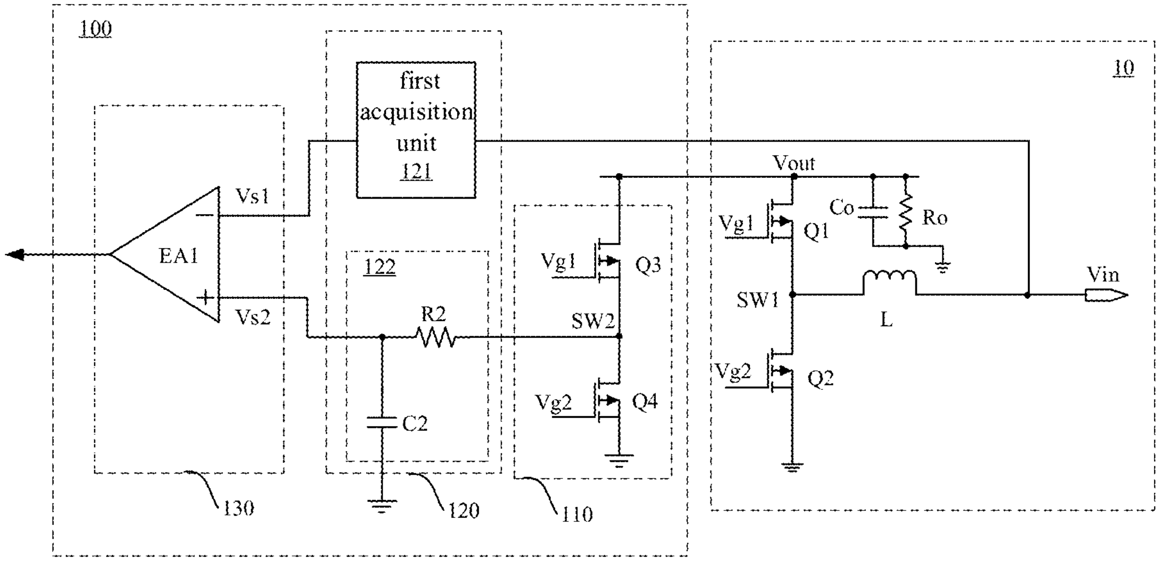
FIG. 7 is a principle diagram of embodiment 1 of the second switch converter of the present disclosure.

As shown in FIG. 7, it shows a principle diagram of embodiment 1 of the second kind of switch converter of the present disclosure, and the power conversion circuit 100 is of a BOOST topology. The power conversion circuit 100 of this embodiment comprises a first switch transistor Q1 and a second switch transistor Q2 connected between the output terminal and the ground terminal. The working principle of the power conversion circuit 100 will not be described in detail. The second switch transistor Q2 is the main switch transistor, and the first switch transistor Q1 is the synchronous switch transistor. The connection node between the main switch transistor Q2 and the synchronous switch transistor Q1 is the first node SW1. An inductor L1 is connected between the first node SW1 and the input terminal, and the current flowing through the inductor is the inductor current IL. The end of inductor L directly connected to the input terminal is considered as the first terminal, and the end of inductor L connected to node SW1 is considered as the second terminal. A capacitor Co is also connected between the output terminal and the ground terminal, and a load resistor Ro is connected in parallel with the capacitor Co. The input terminal of switch converter receives the input voltage Vin, and the output terminal of switch converter generates the output voltage Vout. The main switch transistor and the synchronous switch transistor control the charging and discharging of the inductor to achieve power transmission between the input and output terminals, so as to convert the input voltage Vin into the output voltage Vout. The gates of the main switch transistor and the synchronous switch transistor are connected to the control circuit, and the conduction of the two switch transistors is controlled by the control circuit. The conduction states of the two switch transistors are complementary. Here, the control circuit receives the current sampling signal representing the average value of the inductor current, which is used to control the switching status of the first switch transistor and the second switch transistor. For example, the synchronous switch transistor Q1 receives the first switch control signal Vg1, and the main switch transistor Q2 receives the second switch control signal Vg2. The main switch transistor and synchronous switch transistor can both be either NMOS or PMOS.

The circuit structure of the current sampling circuit 200 in this embodiment comprises a synchronization unit 110, an acquisition unit 120, and an operation unit 240. The synchronization unit 210 comprises a third switch transistor Q3 and a fourth switch transistor Q4 connected in series between the output terminal and the ground terminal, with the connection node between the two being the second node SW2. The fourth switch transistor Q4 and the second switch transistor Q2 receive the same switch control signal Vg2, to turn on and turn off synchronously; the third switch transistor Q3 receives the same switch control signal Vg1 as the first switch transistor Q1, to turn on and turn off synchronously. In this embodiment, the acquisition unit 220 comprises a first acquisition unit 121 and a second acquisition unit 122. The first acquisition unit 121 acquires the first sampling signal Vs1 based on the first terminal voltage of the inductor L, which is the input voltage Vin. The average value of the voltage at the first node SW1 can be equivalent to the input voltage Vin. The second acquisition unit 122 comprises, for example, a first filter, which includes a filtering network composed of resistor R2 and capacitor C2. The second acquisition unit 122 is connected to the second node SW2, to acquire the voltage of the second node, processes it to obtain the average value of the voltage of the second node SW2, and outputs it as the second sampling signal Vs2. The difference between the current sampling circuit 100 in this embodiment and the embodiment in FIG. 5 is that the signals received at the positive and reverse input terminals of the error amplifier EA1 in this embodiment are exactly opposite to those in the embodiment in FIG. 3, that is, the positive input terminal of the error amplifier EA1 receives the first sampling signal Vs1, while the reverse input terminal of the error amplifier EA1 receives the second sampling signal V2. The remaining parts that are the same as those in the embodiment of FIG. 3 will not be repeated.

Figure 8:
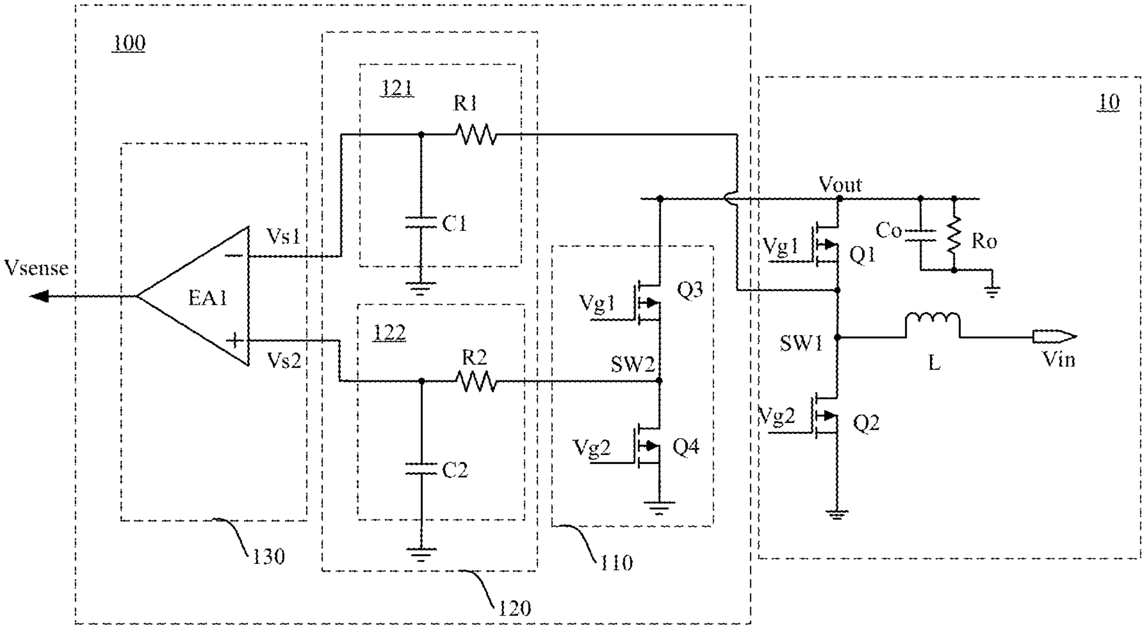
FIG. 8 is a principle diagram of embodiment 2 of the second switch converter of the present disclosure.

As shown in FIG. 8, it shows a principle diagram of embodiment 2 of the second switch converter of the present disclosure, which is an optimized embodiment of FIG. 7. In FIG. 8, the power conversion circuit 102 is of BOOST topology, which is completely the same as the embodiment in FIG. 7, and will not be repeated here. The circuit structure of the current sampling circuit 100 in this embodiment is basically the same as that of the embodiment in FIG. 7. The current sampling circuit 100 in this embodiment also comprises a synchronization unit 110, an acquisition unit 120, and an operation unit 130. Their circuit structures and interconnection relationship are consistent with that of the embodiment in FIG. 4 and will not be repeated.

The difference is that in this embodiment, the first acquisition unit 121 is connected between the first node SW1 and the operation unit 130 to acquire the voltage of the first node SW1 from the second end of inductor L, and then performs filtering processing to obtain the first sampling signal Vs1. Then, the first acquisition unit 121 can also be a filter, including a filtering network composed of resistor R1 and capacitor C1. The remaining parts that are the same as those in the embodiment of FIG. 4 will not be repeated.

In summary, for the types of the switch converters shown in FIGS. 2 and 3 of the present disclosure, their current sampling circuit is formed by the third switch transistor Q3 and the fourth switch transistor Q4 which are connected in series to form a sampling path. Then, the second sampling signal Vs2 is obtained from the sampling path, and the first sampling signal Vs1 is obtained from one end of the inductor, and the inductor current sampling signal Vsense is obtained based on the first sampling signal Vs1 and the second sampling signal Vs2. The structure of the entire current sampling circuit is simple and easy to implement. By relying merely on a simple circuit structure, high-precision sampling results that are linearly related to the inductor current can be obtained. Due to the fact that the first sampling signal Vs1 and the second sampling signal Vs2 respectively represent the average voltage of the first node SW1 and the second node SW2, the current sampling circuit is less affected by noise during voltage sampling, with stable sampling values and easy implementation of sampling. Moreover, the sampling path is directly formed between the input or output terminal and the ground terminal, which has small impact on the second sampling signal Vs2. Therefore, the restrictions on the first sampling transistor Q3 and the second sampling transistor Q4 are small, and there is wide selection range, and the applicability of the current sampling circuit is wide. Then, the requirements for the error amplifier will also be greatly reduced in the meantime. The error amplifier does not need to maintain equal voltage at both input terminals in a short period of time, and the selection range is wider, so the circuit cost is lower.

Figure 9:
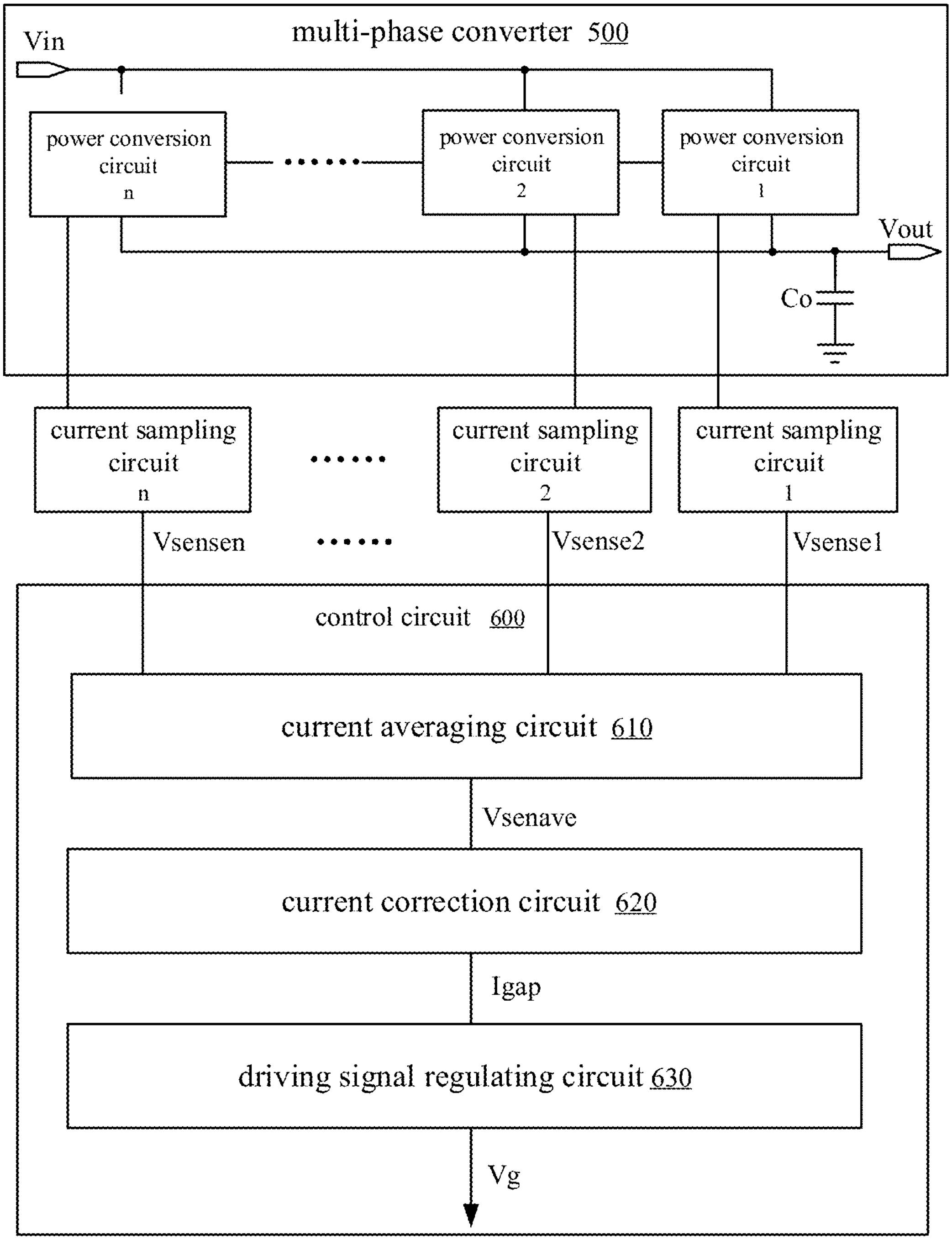
FIG. 9 is a block diagram of multi-phase switch converter of the present disclosure.

As shown in FIG. 9, it shows a block diagram of the multiphase switch converter of the present disclosure. The multiphase switch converter is composed of multiple power conversion circuits connected in parallel, and the control circuit is used to balance the current of each phase power conversion circuit in the multiphase switch converter. The multiphase power conversion circuit is correspondingly connected to multiple current sampling circuits. And each (each stage or each phase of) power conversion circuit is connected to a current sampling circuit for sampling the inductance current information of the corresponding power conversion circuit. The multiphase switch converter includes n cascaded power conversion circuits (1-*n*), which are respectively connected to the multiple current sampling circuits (1-*n*) in one-to-one correspondence. The control circuit 600 of the multiphase switch converter 500 comprises a current averaging circuit 610, a current correction circuit 620, and a driving signal adjustment circuit 630. Each power conversion circuit is connected to a current sampling circuit, and n power conversion circuits correspond one-to-one with n current sampling circuits to obtain n inductor current sampling signals (Vsense1-Vsensen). The current averaging circuit 610 is connected to multiple current sampling circuits to obtain the average current signal Vsenave based on the multiple inductor current sampling signals. The current correction circuit 620 is connected to the current averaging circuit 610 and multiple current sampling circuits, and obtains the inductance current correction signal Igap for each phase based on the inductance current sampling signal of each phase and the average current signal Vsenave. The inductance current correction signal Igap can be, for example, a current signal. The driving signal adjustment circuit 630 is connected to the current correction circuit 620, and adjusts the duty cycle D of each phase driving signal based on the inductance current correction signal Igap of each phase. The driving signal is used to control the turning-on and turning-off of the main switch transistor and the synchronous switch transistor. The driving signal may comprise the above-mentioned switch control signal. When the sampling current signal of the inductor is greater than the average current signal Vsenave, the duty cycle is reduced to decrease the inductor current of the corresponding phase power conversion circuit. If the sampling signal of the inductor current is less than the average current signal Vsenave, increase the duty cycle and increase the inductor current of the corresponding phase power conversion circuit.

Make the inductance current of each phase change converter be the same, i.e. Vsense1=Vsense2=Vsensen.

Figure 10:
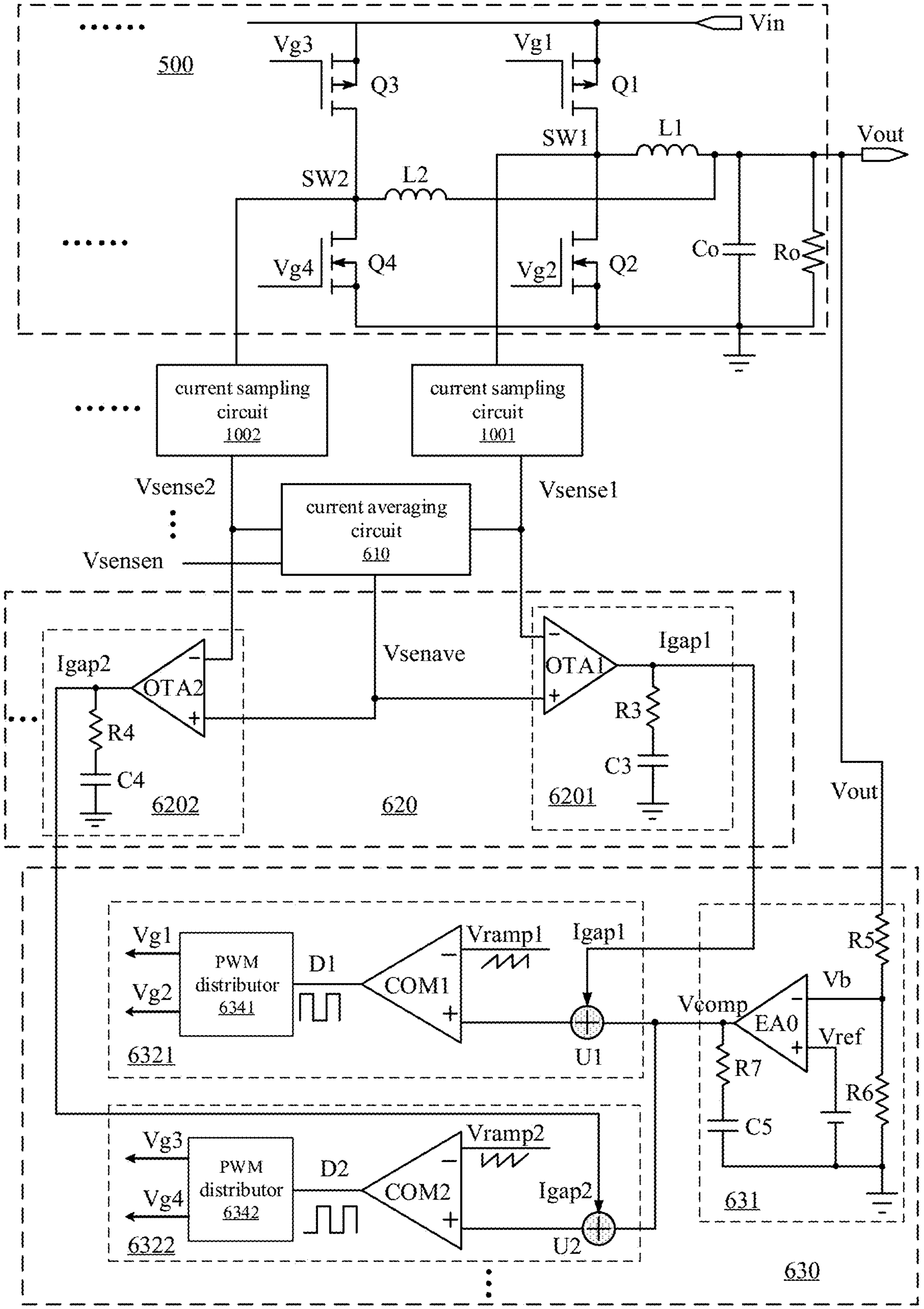
FIG. 10 is a principle diagram of the embodiment of the multi-phase switch converter of the present disclosure.

As shown in FIG. 10, it shows a principle diagram of an embodiment of the multiphase switch converter of the present disclosure. Combined with FIG. 9, the multiphase converter 500 comprises n cascaded power conversion circuits. FIG. 9 illustrates the circuit connection of a two-stage cascaded power conversion circuit as an example, and the two-phase cascaded power conversion circuit is illustrated using a BUCK topology. The input and output terminals of n power conversion circuits are connected together, with the same switch frequency and a phase difference of 360°/n. The control circuit 600 is used to make the inductor current of each power conversion circuit equal, thereby reducing the output voltage ripple, obtaining more stable output, and reducing power consumption.

Specifically, the inductor current of the two-stage power conversion circuit is sampled by the current sampling circuit 1001 and the current sampling circuit 1002, respectively, to obtain the inductor current sampling signal Vsense1 and the inductor current sampling signal Vsense2. For the same reason, the n-phase power conversion circuit corresponds to n current sampling circuits that respectively obtain the inductor current sampling signals (Vsense1-Vsensen) for each phase power conversion circuit. Then, all n sampled inductor current signals are input into the current averaging circuit 610, and the n values are averaged to obtain the average current signal Vsenave (for example, dividing the sum of n inductor current sampling signals by n to obtain the average current signal Vsenave).

The current averaging circuit 610 is connected to the current correction circuit 620, which comprises multiple identical current correction units (e.g., 6201 and 6202), each of which includes an operational amplifier. The operational amplifier can be an OTA (operational transconductance amplifier), which is an amplifier that can convert input differential voltage into output current, and it is a voltage controlled current source. When n is 2, the reverse input terminal of the operational amplifier OTA1 of the current correction unit 6201 is connected to the current sampling circuit 1001, to receive the inductor current sampling signal Vsen1; the positive input terminal is connected to the current averaging circuit 610, receiving the average current signal Vsenave; a resistor R3 and a capacitor C3 are connected between the output terminal and the ground terminal, and the output terminal outputs the inductor current correction signal Igap1. Similarly, the reverse input terminal of the operational amplifier OTA2 of the current correction unit 6202 is connected to the current sampling circuit 1002, to receive the inductor current sampling signal Vsense2, the positive input terminal of the operational amplifier OTA2 is connected to the current averaging circuit 610, to receive the average current signal Vsenave; a resistor R4 and a capacitor C4 are connected between the output terminal and the ground terminal, and the output terminal outputs an inductor current correction signal Igap2. When n is greater than 2, each current sampling circuit of the power conversion circuit is connected to a current correction unit correspondingly and outputs an inductor current correction signal.

Furthermore, n inductor current correction signals are all input to the driving signal adjustment circuit 630. The driving signal adjustment circuit 630 includes an error amplification unit 631 and multiple driving signal generation units (e.g., 6321 and 6322). The error amplification unit 631 generates an error amplification signal Vcomp based on the output voltage Vout of the multiphase converter and the reference voltage Vref. Specifically, the error amplification unit 631 comprises resistors R5 and R6 connected in series between the output terminal and the ground. The output voltage Vout is divided to generate a feedback signal Vb, which is then transmitted to the reverse input terminal of the error amplifier EA0, the reference voltage Vref generated by the power supply is connected to the positive input terminal of the error amplifier EA0. The difference between the feedback signal Vb and the reference voltage Vref is amplified by the error amplifier EA0 and output as the error amplification signal Vcomp at the output terminal. The error amplification unit 631 also comprises resistor R7 and a capacitor C5 connected in series between the output terminal of the error amplifier EA0 and the ground, which play a filtering role.

In the multiple driving signal generation units, each driving signal generation unit is connected to a current correction unit, i.e., the two are connected in a one-to-one correspondence. And each driving signal generation unit generates the duty cycle of the driving signal based on the received inductor current correction signal, the error amplification signal, and the ramp signal. The duty cycle of the driving signal is used to control the conduction time of the main switch transistor. For example, the driving signal generation unit 6321 is connected to the current correction unit 6201 and the error amplification unit 631, to receive the inductor current correction signal Igap1 and the error amplification signal Vcomp; the driving signal generation unit 6322 is connected to the current correction unit 6202 and the error amplification unit 631, to receive the inductor current correction signal Igap2 and the error amplification signal Vcomp.

Specifically, the driving signal generation unit 6321 comprises a comparator COM1 and an adder U1. The output of the adder U1 performing operations on the inductor current correction signal Igap1 and the error amplification signal Vcomp, is input into the positive input terminal of the comparator COM1. The reverse input terminal of comparator COM1 receives a ramp signal Vramp1, and the generation of the ramp signal is not described in detail. The comparator COM1 outputs the duty cycle D1 of the driving signal based on the comparison results of the two input terminals. The driving signal generation unit 6321 also comprises a PWM distributor 6341, which receives the duty cycle of the driving signal and generates the driving signal accordingly. The driving signal comprises, e.g., switch control signals for the main switch transistor and the synchronous switch transistor. The main switch transistor correspondingly controlled by the driving signal generation unit 6321 is Q1, and the synchronous switch transistor is Q2. Therefore, the driving signals can be the first switch control signal Vg1 and the second switch control signal Vg2. Similarly, the driving signal generation unit 6322 comprises a comparator COM2 and an adder U2. The output of adder U2 performing operations on the inductor current correction signal Igap2 and the error amplification signal Vcomp, is put into the positive input terminal of the comparator COM2. The reverse input terminal of comparator COM2 receives the ramp signal Vramp2, and comparator COM2 outputs the duty cycle D2 of the driving signal based on the comparison result between the two input terminals of the comparator COM2. The PWM distributor 6342 receives the duty cycle D2 of the driving signal and generates the driving signal accordingly. The driving signal comprises for example, the third switch control signal Vg3 and the fourth switch control signal Vg4. The driving signal adjustment circuit 630 when n is greater than 2 will not be repeated here.

Furthermore, by subtracting the inductor current sampling signal from the average current signal Vsenave, a current correction signal is obtained, and the respective duty cycles are adjusted accordingly. If the inductor current sampling signal is greater than the average current signal Vsenave, the duty cycle is reduced, thereby reducing the inductor current of the corresponding phase of converter. If the sampled signal of the inductor current is less than the average current signal Vsenave, the duty cycle is increased, thereby increasing the inductor current of the corresponding phase converter. Make the inductance current of each phase change converter be the same, i.e. Vsense1=Vsense2=Vsensen. Thus, the control circuit 600 of this embodiment is adopted to achieve current sharing control of the multiphase converter 500 of this embodiment.

Figure 11:
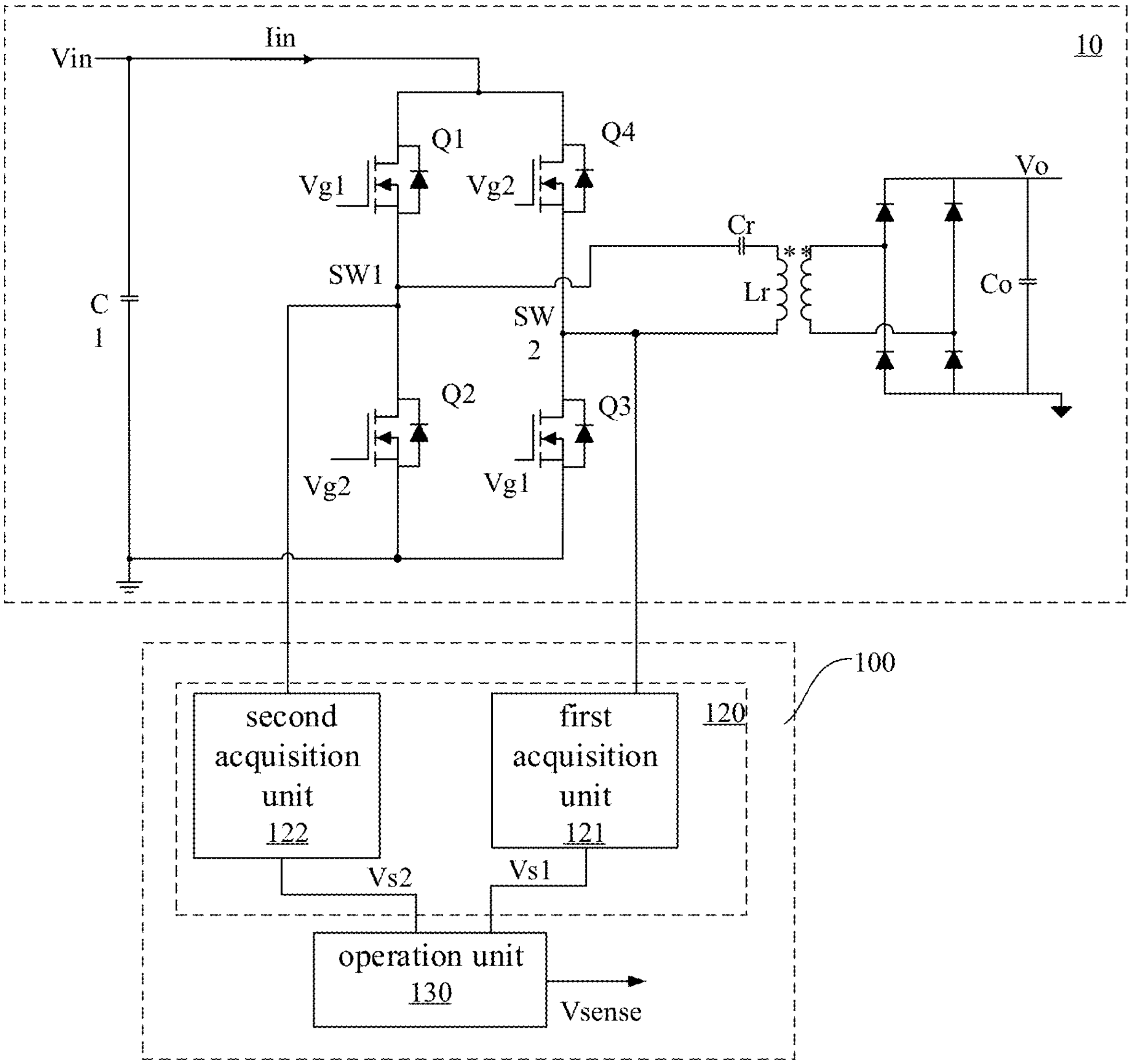
FIG. 11 is a principle diagram of embodiment 1 of the third switch converter of the present disclosure.

As shown in FIG. 11, it shows a principle diagram of the first embodiment of the third switch converter of the present disclosure. Take the first control mode as an example to explain, in the first control mode, the first switch transistor Q1 and the third switch transistor Q3 are turned on and turned off simultaneously, and the second switch transistor Q2 and the fourth switch transistor Q4 are turned on and turned off simultaneously. The conduction states of the first switch transistor Q1 and the second switch transistor Q2 are complementary. In the second switching status when the second switch transistor Q2 and the fourth switch transistor Q4 are turned on, the voltage of the first node SW1 is acquired, and Vsw1=I2×$R_{Q2}$ is obtained; in the first switching status when the first switch transistor Q1 and the third switch transistor Q3 are turned on, the voltage of the second node SW2 is acquired, and Vsw2=I1×$R_{Q3}$ is obtained; since Vsw1+Vsw2=(I1+I2)×$R_Q$, the mean value Vsw1 of the first node voltage is obtained when the second switch transistor Q2 and the fourth switch transistor Q4 are turned on, and the mean value Vsw2 of the second node voltage is obtained when the first switch transistor Q1 and the third switch transistor Q3 are turned on. Since the conduction resistance $R_Q$ of the switch transistor is a fixed value, Vsw1+Vsw2=(I1+I2)×$R_Q$ can be calculated to obtain the average input current of the H-bridge converter; furthermore, the size of the conduction resistance $R_Q$ can be known from the specification sheet of switch transistors models by the manufacturer, so the conduction resistance $R_Q$ is a known parameter.

Based on the above analysis of the current sampling principles, refer to FIG. 11, the current sampling block diagram comprises a first acquisition unit U01, a second acquisition unit U02, and an operation unit U03. When the second switch transistor Q2 is turned on, the second acquisition unit U02 acquires the first node voltage Vsw1 and outputs a second sampling signal Vs2 representing the average value Vsw1 of the first node voltage; the first acquisition unit U01 obtains the second node voltage Vsw2 when the third switch transistor Q3 is turned on, and outputs the first sampling signal Vs1 representing the average value Vsw2 of the second node voltage; the operation unit U03 calculates the sum of the first sampling signal Vs1 and the second sampling signal Vs2 to obtain the current sampling signal Vs representing the average input current; furthermore, the scaling factor K is set based on the amplitude of the conduction resistance $R_Q$ and the device parameters in the acquisition unit. The operation unit U03 multiplies the current sampling signal Vs with the scaling factor to obtain the input average current signal Iin; Optionally, the operation unit U03 also receives a bias voltage Voffset, and superimposes the bias voltage Voffset on the sum of the first sampling signal Vs1 and the second sampling signal Vs2 to obtain the sampling signal of the average current. By superimposing the bias voltage Voffset, the sampling signal obtained can be avoided from being zero voltage/current, thus meeting the sampling standards of some products, that is, when the average input current is zero, the obtained current sampling signal is not zero but equal to the magnitude of the bias voltage Voffset.

Figure 12:
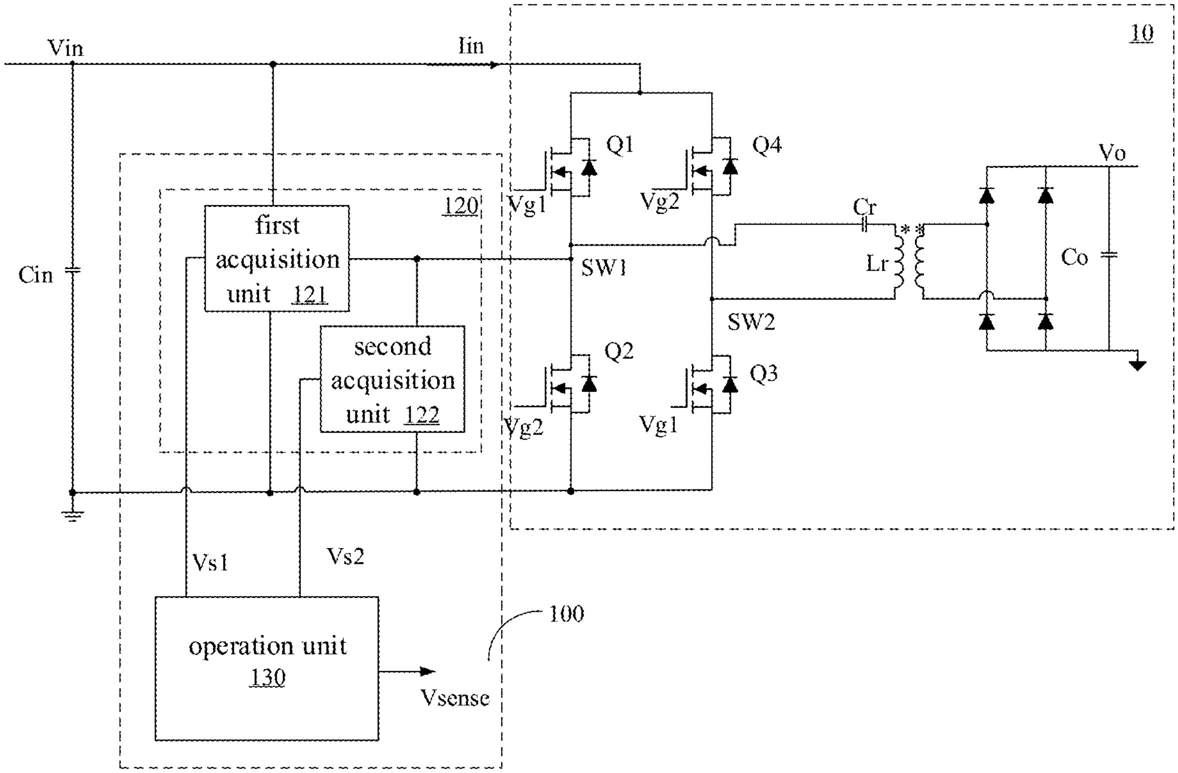
FIG. 12 is a principle diagram of embodiment 2 of the third switch converter of the present disclosure

As shown in FIG. 12, it shows a principle diagram of embodiment 2 of the third kind of switch converter of the present disclosure. The sampling principle of this embodiment is as follows. Refer to the sampling principle described in FIG. 11, the repeated parts will not be elaborated again; acquire the first node voltage Vsw1=Vin−I1×$R_{Q1}$ in the first switching status when the first and third switch transistors Q1 and Q3 are turned on; acquire the second node voltage Vsw2=Vin−I2×$R_{Q1}$ in the second switching status when the second and fourth switch transistors Q2 and Q4 are turned on; furthermore, (I1+I2)×$R_Q$=Vin−(Vsw1+Vsw2), thus acquiring the mean of the first node voltage Vsw1 and the second node voltage Vsw2 under the corresponding state and summing them up can obtain the average input current. According to the above analysis, the block diagram shown in FIG. 4 is set up, comprising a first acquisition unit U01, a second acquisition unit U02, and an operation unit U03. The first acquisition unit U01 acquires the first node voltage Vsw1 when the inductor is charged and obtains the first sampling signal Vs1 representing the mean value of the first node voltage. The second acquisition unit U02 acquires the second node voltage Vsw2 when the inductor is discharged and obtains the second sampling signal Vs2 representing the mean value of the second node voltage. The operation unit U03 calculates the difference between Vin and Vs1+Vs2 to obtain the current sampling signal Vs representing the average input current. Furthermore, the scaling coefficient K is set according to the amplitude of the conduction resistance $R_Q$ and the device parameters in the acquisition unit. The operation unit U03 multiplies the current sampling signal Vs with the scaling coefficient to obtain the input average current signal Iin.

Figure 13:
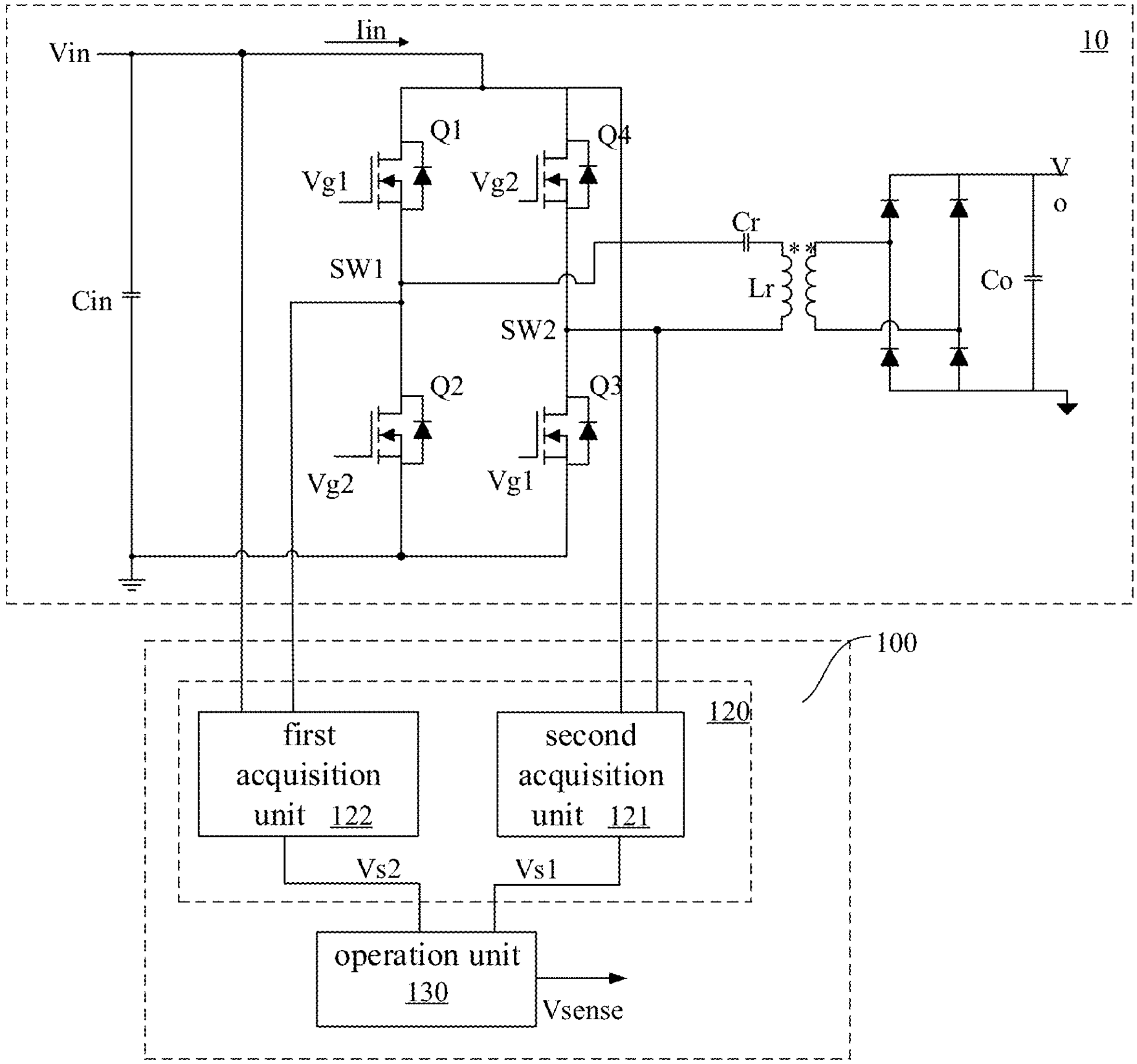
FIG. 13 is a principle diagram of embodiment 3 of the third switch converter of the present disclosure.

As shown in FIG. 13, it shows the principle diagram of embodiment 3 of the third kind of switch converter of the present disclosure. The sampling principle under this embodiment is as follows: refer to the sampling principle described in FIG. 11, the repeated parts will not be elaborated again: acquiring the first node voltage Vsw1=Vin−I1×$R_{Q1}$ in the first switching status when the first and third switch transistors Q1 and Q3 are turned on, and acquiring the first node voltage Vsw1'=I2×$R_{Q2}$ in the second switching status when the second and fourth switch transistors Q2 and Q4 are turned on; furthermore, it can obtain (I1+I2)×$R_Q$=Vin−Vsw1+Vsw1', thus obtaining the average voltage of the first node under different switching status and performing calculation to obtain the average input current. According to the above analysis, set the block diagram shown in FIG. 4. The first acquisition unit U01 acquires the first node voltage $V_{SW1}$ when the inductor is charged and obtains the first sampling signal Vs1 representing its mean value. The second acquisition unit U02 acquires the first node voltage Vsw1' when the inductor is discharged and obtains the second sampling signal Vs2 representing its mean value. The operation unit U03 calculates Vin−Vs1+Vs2 to obtain the current sampling signal Vs representing the average input current. Furthermore, based on the amplitude of the conduction resistance $R_Q$ and the device parameters in the acquisition unit, a scaling factor K is set. The operation unit U03 multiplies the current sampling signal Vs with the scaling factor to obtain the input average current signal Iin.

Figure 14:
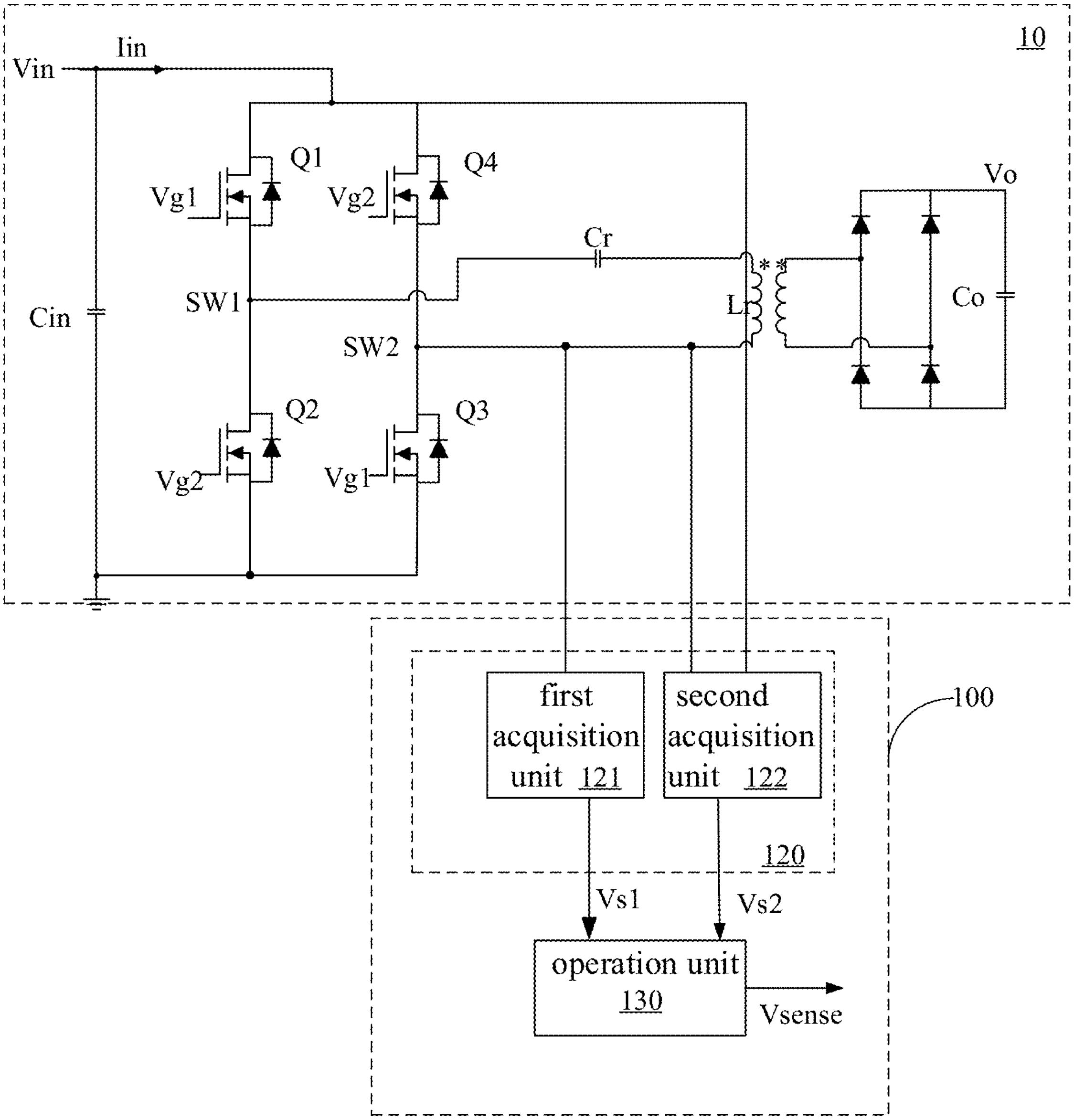
FIG. 14 is a principle diagram of embodiment 4 of the third switch converter of the present disclosure.

As shown in FIG. 14, it shows the principle diagram of embodiment 4 of the third kind of switch converter of the present disclosure. The sampling principle of this embodiment is as follows: refer to the sampling principle described in FIG. 11, and the repeated parts will not be elaborated again; acquiring the second node voltage Vsw2=I1×$R_{Q3}$ in the first switching status when the first and third switch transistors Q1 and Q3 are turned on; acquiring the second node voltage Vsw2'=Vin−I2×$R_{Q4}$ in the second switching status when the second and fourth switch transistors Q2 and Q4 are turned on; furthermore, (I1+I2)×$R_Q$=Vin−Vsw2'+Vsv2 can be obtained, thus obtaining the mean voltage of the second node under different states and calculating to obtain the average input current. According to the above analysis, set the schematic diagram shown in FIG. 14. The first acquisition unit U01 acquires the second node voltage Vsw2 when the inductor is charged, and obtains the first sampling signal Vs1 representing its mean value. The second acquisition unit U02 obtains the second node voltage Vsw2' during inductor discharging and obtains the second sampling signal Vs2 representing its mean value. The operation unit U03 calculates Vin−Vs2+Vs1 to obtain the current sampling signal Vs representing the average input current. Furthermore, based on the size of the conduction resistance $R_Q$ and the device parameters in the acquisition unit, a scaling factor K is set. The operation unit U03 multiplies the current sampling signal Vs with the scaling factor to obtain the input average current signal Iin.

In summary, the bridge switching converter illustrated in FIG. 4 of the present disclosure can also refer to the above method in the second control mode. In the first switching status, the average of the first node voltage or the second node voltage is acquired to obtain the first sampling signal, and in the second state, the average of the first node voltage or the second node voltage is acquired to obtain the second sampling signal. Based on the first sampling signal and the second sampling signal, the average input current can be obtained; this is because in the third switching status, when the inductor current flows through the first and fourth switch transistors Q1 and Q4, the energy circulates in the loop where switch transistors Q1 and Q4 are located, and no longer receives current/energy from the input terminal. Therefore, there is no need to calculate the average input current for this stage; similarly, in the fourth switching status, energy circulates in the loop where the switch transistor Q2 and Q3 are located, and no longer receives current/energy from the input terminal, so there is no need to calculate the average input current for this stage. Therefore, regardless of the first control method or the second control method, as long as the average voltage of the nodes in the first switch state and the second switch state are acquired separately, the average input current can be obtained. Similarly, it can be understood that under other phase shifting control methods, the average input current can be obtained by simply taking the average voltage of the nodes in the first and second switching status.

Figure 15:
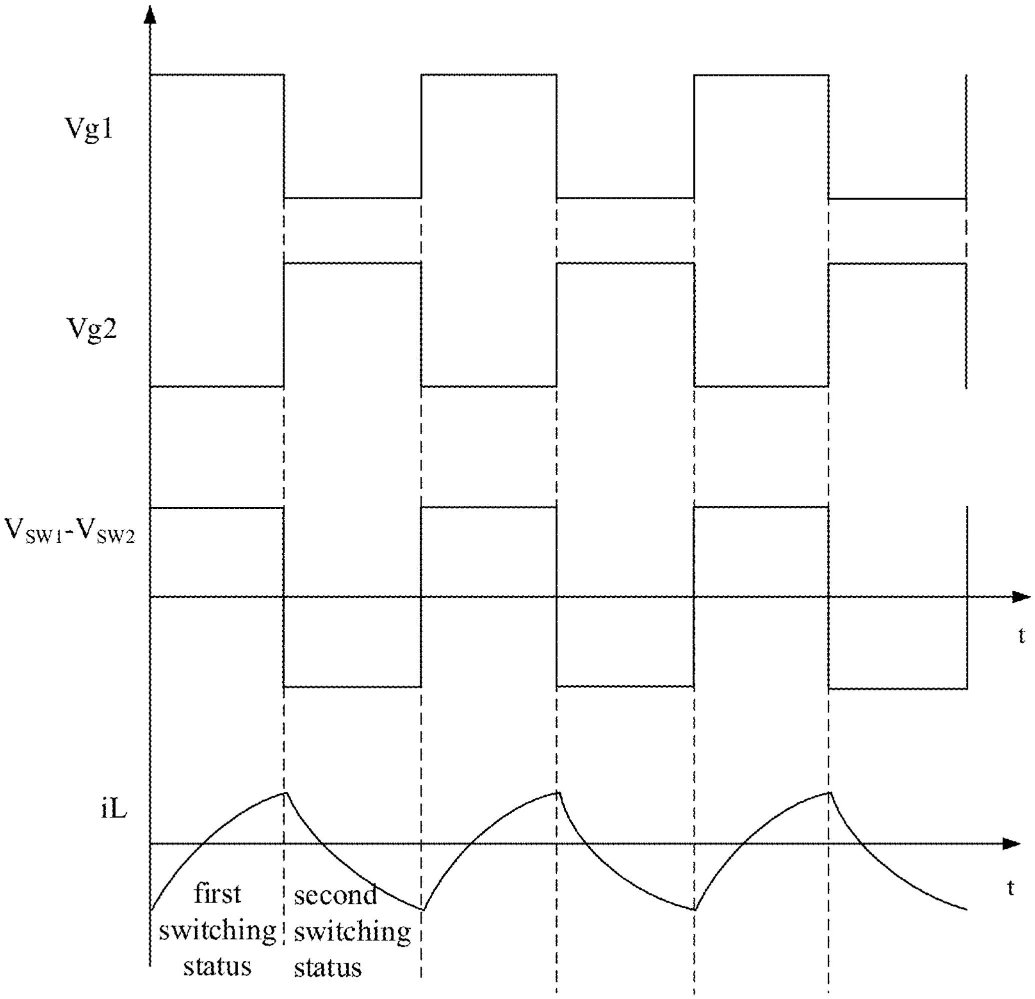
FIG. 15 is a signal waveform diagram of the first control manner of the third switch converter of the present disclosure.

As shown in FIG. 15, it shows the signal waveform diagram of the first control mode of the third switch converter of the present disclosure. Vg1 is the first control signal waveform for controlling the first and second switch transistors, and Vg2 is the second control signal waveform for controlling the third and fourth switch transistors; $V_{SW1}-V_{SW2}$ are the waveforms of the first node voltage $V_{SW1}$ minus the second node voltage $V_{SW2}$, and iL is the inductor current waveform. From the figure, it can be seen that the first control signal Vg1 and the second control signal Vg2 are complementary. When Vg1 is high level and Vg2 is low level, the first and third switch transistors Q1 and Q3 are turned on, and the inductor current iL rises as shown in the figure; when Vg1 is low level and Vg2 is high level, the second and fourth switch transistors Q2 and Q3 are turned on, and the inductor continues to flow. The inductor current iL decreases as shown in the figure.

Figure 16:
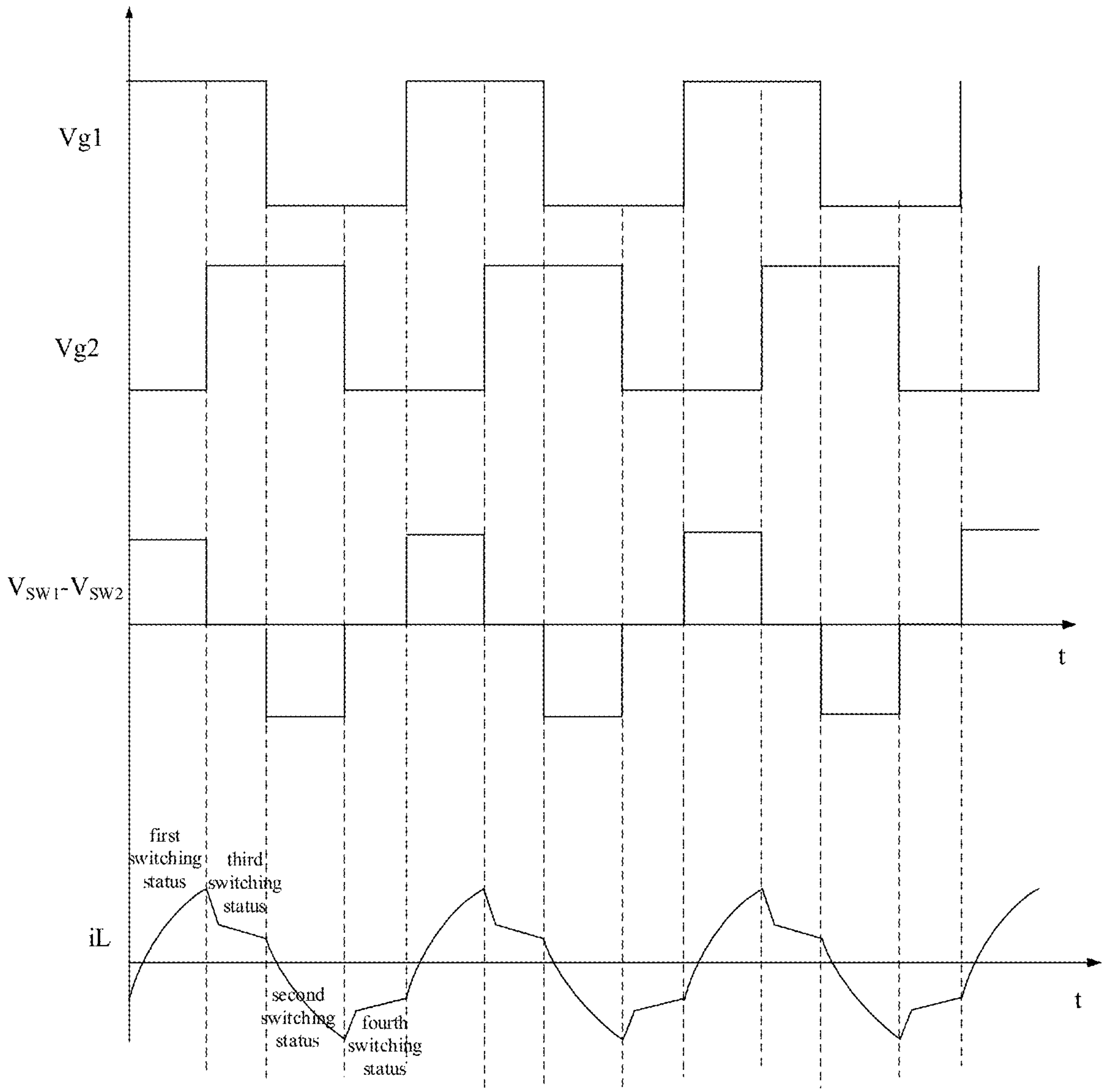
FIG. 16 is a signal waveform diagram of the second control manner of the third switch converter of the present disclosure.

As shown in FIG. 16, it shows the signal waveform diagram of the second control mode of the third switch converter of the present disclosure. The meanings of waveform of Vg1, Vg2, $V_{SW1}-V_{SW2}$, and iL are consistent with those in FIG. 8, and will not be repeated; Vg1 and Vg2 are out of phase here. When Vg1 is high level and Vg2 is low level, switch transistors Q1 and Q3 are turned on, and the inductor current iL increases as shown in the figure; when Vg1 is high level and Vg2 is high level, the switch transistors Q1 and Q4 are turned on, and energy circulates in the loop where the switch transistors Q1 and Q4 are located. No current/energy is input to the input terminal, and the waveform is shown in the figure; When Vg1 is low level and Vg2 is high level, the switch transistors Q2 and Q4 are turned on, and the inductor current iL decreases as shown in the figure; when Vg1 is low level and Vg2 is low level, the switch transistors Q2 and Q3 are turned on, and energy circulates in the loop where the switch transistors Q2 and Q3 are located. The H-bridge circuit does not input current/energy, and the waveform of the inductor current iL is shown in the figure.

Figure 17:
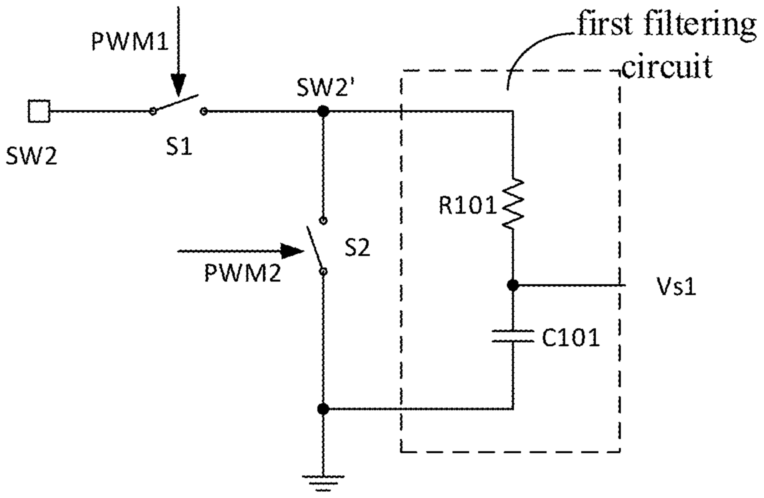
FIG. 17 is a circuit principle diagram of a first kind of first acquisition unit of the third switch converter of the present disclosure.

As shown in FIG. 17, it shows a circuit principle diagram of the first kind of first acquisition unit of the third switch converter of the present disclosure. The third switch converter is an H-bridge switch converter. The first acquisition unit acquires the second node voltage when the third switch transistor Q3 is turned on, including a sampling transistor S1 and a first filtering circuit. The first filtering circuit comprises a first resistor R101 and a first capacitor C101 connected in series. The first end of the first sampling transistor S1 is connected to the second node SW2 and its second end is connected to the first end of the first resistor R101. The second end of the first resistor R101 is connected to the first end of the first capacitor C101, and the second end of the first capacitor C101 is connected to the ground. The first resistor R101 and the first capacitor C101 are connected to output the first sampling signal Vs1; when the third switch transistor Q3 is turned on, i.e. in the first switching status, the first sampling transistor S1 is turned on. When the third switch transistor Q3 is turned off, the first sampling transistor S1 is turned off, i.e., the switching status of the sampling transistor S1 is the same as that of the third switch transistor Q3; when the sampling transistor S1 is an ideal switch transistor, after the first switch transistor S1 is turned off, the voltage at the input terminal SW2' of the first filtering circuit drops to the voltage on the first capacitor C101, that is, the first sampling signal Vs1 can denote the average voltage VSW2 of the second node when the second switch transistor is turned on; however, in practical applications, it is sometimes difficult to approach the ideal completely disconnected state when the switch transistor is turned off. That is, after the first sampling transistor S1 is turned off, the first sampling transistor S1 is equivalent to a resistor with a larger resistance value connected between the second node SW2 and node SW2'. After that, the fourth switch transistor Q4 is turned on, and the voltage at the second node SW2 is pulled up to Vin−I2*$R_{Q4}$, and the voltage at SW2' is also pulled up; the first sampling signal Vs1 obtained from the voltage at SW2' after passing through the first filtering circuit will deviate from the expected mean of the second node voltage Vsw2. Therefore, in another embodiment, the first acquisition unit further comprises a second sampling transistor S2, which is connected in parallel with the filtering circuit. After the first sampling transistor S1 is turned off, the second sampling transistor S2 is controlled to conduct, pulling the voltage at SW2' to ground potential. The first sampling signal Vs1 obtained in this way can characterize the mean value of the second node voltage Vsw2. Other methods of obtaining the average node voltage can also be used, and this application does not limit this.

Figure 18:
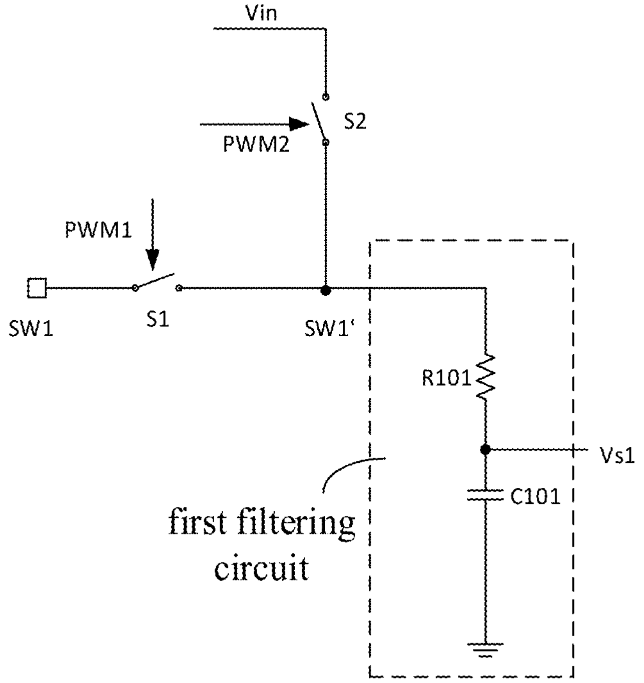
FIG. 18 is a circuit principle diagram of a second kind of first acquisition unit of the third switch converter of the present disclosure.

As shown in FIG. 18, it shows the circuit principle diagram of the second kind of first acquisition unit of the third switching converter of the present disclosure. The first acquisition unit acquires the voltage of the first node when the first switch transistor Q1 is turned on, which is consistent with the circuit principle of the first acquisition unit of FIG. 9. It comprises a sampling transistor S1 and a first filtering circuit. The first filtering circuit comprises a first resistor R101 and a first capacitor C101 which are connected in series. The first sampling transistor S1 has its first end connected to the first node SW1 and its second end connected to the first end of the first resistor R101. The second end of the first resistor R101 is connected to the first end of the first capacitor C101, and the second end of the first capacitor C101 is connected to the ground. The first resistor R101 and the first capacitor C101 are connected to output the first sampling signal Vs1; in this embodiment, when the first switch transistor Q1 of the H-bridge circuit is turned on, i.e., in the first switching status, the sampling transistor S1 is turned on. When the first switch transistor Q1 is turned off, the sampling transistor S1 is turned off, i.e., the switching status of the sampling transistor S1 is the same as that of the first switch transistor Q1. In practical applications, it is sometimes difficult to approach the ideal completely disconnected state when the switch transistor is turned off. That is, after the sampling transistor S1 is turned off, the sampling transistor S1 is equivalent to a resistor with a larger resistance value connected between the first node SW1 and node SW1'. After that, the second switch transistor Q2 is turned on, and the voltage at the first node SW1 is pulled to $I2*R_{Q2}$, and the voltage at SW1' is also pulled down. Therefore, the obtained first sampling signal Vs1 will be inaccurate; therefore, it is set that a second sampling transistor S2 is connected to the input terminal and the connection terminal of the sampling transistor S1 and the first filtering circuit. The switching status of the second sampling transistor S2 is complementary to that of the sampling transistor S1 to avoid obtaining inaccurate first sampling signal Vs1.

Refer to the above analysis, it can obtain the circuit principle diagram of the second acquisition unit, which will not be further elaborated here; although the present disclosure does not further illustrate the schematic diagram of the second acquisition unit, according to the analysis of the present disclosure, it is set that any second acquisition unit circuit according to the circuit principle of the first acquisition unit of the present disclosure is within the protection scope of the present disclosure.

Figure 19:
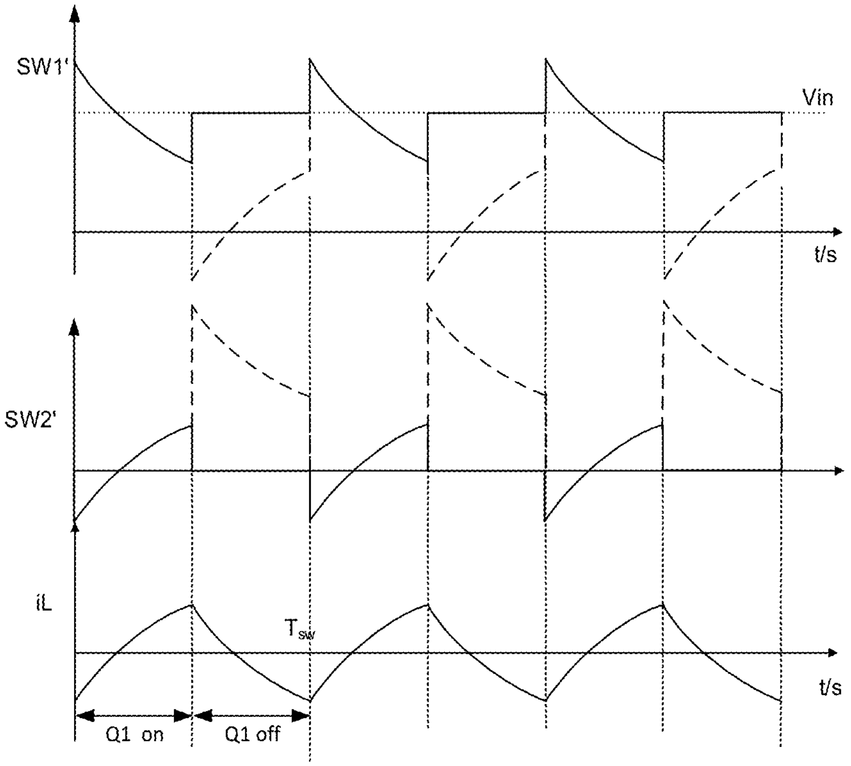
FIG. 19 is a signal waveform diagram of the first acquisition unit of the present disclosure.

As shown in FIG. 19, the waveform diagram of the first acquisition unit is illustrated, which illustrates the waveform of the voltage $V_{SW1}'$ at the connection terminal between the sampling transistor and the first filtering circuit when sampling the voltage of the first node, the waveform of the voltage $V_{SW2}'$ at the connection terminal between the sampling transistor and the second filtering circuit when sampling the voltage of the second node, and the waveform of the inductor current iL. During the conduction stage of the first and third switch transistors Q1 and Q3, the voltage $V_{SW1}'$ waveform is consistent with the voltage $V_{SW1}$ waveform of the first node; the voltage $V_{SW1}$ of the first node decreases, and the voltage $V_{SW2}'$ waveform is consistent with the voltage $V_{SW2}$ waveform of the second node, and the voltage of the second node increases; after the first and third switch transistors Q1 and Q3 are turned off, due to the presence of the sampling transistor S2, the sampling transistor S2 is turned on, the voltage $V_{SW1}$ 'is pulled to the input voltage Vin, and the voltage $V_{SW2}$' is pulled to the ground potential. After passing through the filtering circuit, the corresponding first sampling signal Vs1 is obtained; When sampling transistor S2 is not set, if sampling transistor S1 cannot be completely turned off in practical applications after it is turned off, sampling transistor S1 is equivalent to a large resistor, and the voltage of nodes SW1 'and SW2' will be correspondingly pulled to the dashed line position in the drawing, which will make the obtained first sampling signal Vs1 be inaccurate.

The third type of switch converter of the present disclosure, namely the H-bridge switch converter, can obtain the average input current by filtering the voltage of the first node and the voltage of the second node. The solution is simple and does not require direct sampling or sampling the input current in different time periods, so as to avoid problems such as interference in sampling, low sampling accuracy, loss caused by sampling, or other low reliability issues. The present disclosure also takes into account the problem of poor switching off of sampling transistors for node voltage. By setting two sampling transistors in one acquisition unit, the sampling signal obtained by the present disclosure will not deviate from the expected value and has high accuracy.

To sum up, in all the above embodiments, it is necessary to obtain a current sampling signal based on the voltage of at least one end of the inductor. Furthermore, all of them require four switch transistors, at least two of which are power transistors. Furthermore, the switching status of the first and third switch transistors are the same, and the switching status of the second and fourth switch transistors are the same. Furthermore, the current sampling signal is obtained based on the relationship between the switch node voltage Vsw and the current.

Although the above embodiments have been separately explained and elaborated, some common technologies involved can be replaced and integrated among the embodiments in the eyes of those of ordinary skill in the art. If there is any content that is not explicitly recorded in one embodiment, reference can be made to other recorded embodiments.

The above implementation methods do not constitute a limitation on the protection scope of the technical solution. Any modifications, equivalent substitutions, and improvements made within the spirit and principles of the above implementation shall be included within the scope of protection of the technical solution.

What is claimed is:

1. A switch converter, comprising at least a first switch transistor, a second switch transistor, and an inductor, wherein the switch converter further comprises:

- an acquisition unit for acquiring voltage of at least one end of the inductor, to obtain a first sampling signal and a second sampling signal;
- an operation unit, to perform operations on the first sampling signal and the second sampling signal to obtain a current sampling signal;
- a control circuit, to receive the current sampling signal for controlling the switching status of the first switch transistor and second switch transistor; and
- a third switch transistor and a fourth switch transistor which are connected, wherein, under the first switching status, the first switch transistor and the third switch transistor are turned on synchronously, and the second switch transistor and the fourth switch transistor are turned off synchronously;

under the second switching status, the second switch transistor and the fourth switch transistor are turned on synchronously, and the first switch transistor and the third switch transistor are turned off synchronously.

2. The switch converter of claim 1, wherein the current sampling signal denotes an average value of the inductor current, and one end of the inductor is connected to a common connection terminal of the first switch transistor and the second switch transistor, and the other end of the inductor is the input end or the output end of the switch transistor.

3. The switch converter of claim 2, wherein comprising: the acquisition unit comprises:

a first acquisition unit for acquiring the voltage of one end of the inductor, to obtain the first sampling signal;

a second acquisition unit for acquiring the voltage of the second node between the third switch transistor and the fourth switch transistor, to obtain the second sampling signal denoting an average value of the voltage of the second node.

4. The switch converter of claim 3, wherein one end of the inductor which is directly connected to the output end or the input end of the switch converter is the first end of the inductor, and the first acquisition unit acquires the first sampling signal from the first terminal of the inductor.

5. The switch converter of claim 3, wherein one end of the inductor which is connected to the first node between the first switch transistor and the second switch transistor is a second end of the inductor, the first acquisition unit is connected to the second end of the inductor for acquiring the voltage on the first node, to obtain the first sampling signal denoting the average value of the voltage of the first node.

6. The switch converter of claim 3, wherein the operation unit comprises an error amplifier, and the error amplifier receives the first sampling signal and the second sampling signal, to output the current sampling signal, and an amplifying coefficient of the error amplifier is K, K being a positive number.

7. The switch converter of claim 5, wherein the first acquisition unit and the second acquisition unit comprise a first filter and a second filter respectively; the first filter filters the volage of the first node to obtain the first sampling signal, and the second filter filters voltage of the second node to obtain the second sampling signal.

8. The switch converter of claim 3, wherein the switch converter is a multi-phase switch converter, and each phase of switch converter comprises the first switch transistor, the second switch transistor, and the inductor, and each phase of switch converter obtains the current sampling signal, and the multi-phase converter obtains correspondingly multiple current sampling signals; further comprising, a current averaging circuit, to obtain an average current signal based on the multiple current sampling signals;

a current correction circuit, to obtain the inductance current correction signal of each phase of switch converter based on the current sampling signal of each phase of switch converter and the average current signal; and a driving signal regulating circuit, to regulate a duty cycle of the driving signal of each phase of switch converter based on the inductance current correction signal of each phase of switch converter; the driving signal is used to control the first switch transistor and second switch transistor of each phase of switch converter to turn on and off.

9. The switch converter of claim 8, wherein the current correction unit comprises multiple current correction units, and each current correction unit comprises an operation amplifier to obtain the inductor current correction signal according to the current sampling signal and the average current signal.

10. The switch converter of claim 2, wherein the current sampling signal denotes the average value of the input current of the switch converter, a first node between the first switch transistor and the second switch transistor is connected to one end of the inductor, and the second node between the third switch transistor and the fourth switch transistor is connected to another end of the inductor.

11. The switch converter of claim 10, wherein the acquisition unit comprises:

a first acquisition unit for acquiring the voltage of the first node or the second node under the first switching status, to obtain a first sampling signal denoting the voltage average value of the corresponding node;

a second acquisition unit for acquiring the voltage of the first node or the second node under the second switching status, to obtain a second sampling signal denoting the voltage average value of the corresponding node.

12. The switch converter of claim 11, wherein: the first sampling signal denotes an average value of the input current under the first switching status; the second sampling signal denotes the average value of the input current under the second switching status.

13. The switch converter of claim 12, wherein the first acquisition unit acquires voltage of the first node under the first switching status to acquire the first sampling signal, the second acquisition unit acquires the voltage of the first node under the second switching status to acquire the second sampling signal;

the operation unit calculates the difference between the input voltage of the switch converter and the first sampling signal, and obtains the current sampling signal according to a sum of the difference and the second sampling signal.

14. The switch converter of claim 12, wherein the first acquisition unit acquires the voltage of the second node under the first switching status to obtain the first sampling signal, the second acquisition unit acquires the voltage of the second node under the second switching status to obtain the second sampling signal;

the operation unit calculates the difference between the input voltage of the switch converter and the second sampling signal, and obtains the current sampling signal according to a sum of the difference and the first sampling signal.

15. The switch converter of claim 12, wherein: the first acquisition unit acquires the voltage of the first node under the first switching status to obtain the first sampling signal, the second acquisition unit acquires the voltage of the second node under the second switching status to obtain the second sampling signal;

the operation unit calculates the difference between double the input voltage of the switch converter and the sum of the first sampling signal and the second sampling signal to obtain the current sampling signal.

16. The switch converter of claim 12, wherein the first acquisition unit acquires the voltage of the second node under the first switching status to acquire the first sampling signal;

the second acquisition unit acquires the voltage of the first node under the second switching status to acquire the second sampling signal;

the operation unit calculates the sum of the first sampling signal and the second sampling signal to obtain the current sampling signal.

17. The switch converter of claim 13, wherein the first acquisition unit comprises a first sampling transistor, a second sampling transistor, and a first filtering circuit, a first terminal of the first sampling transistor is connected to the first node, and a second terminal of the first sampling transistor is connected to the first terminal of the first filtering circuit, and the second terminal of the first filter is connected to the reference ground;

the first filtering circuit generates the first sampling signal, and the second sampling transistor is connected between the first terminal of the first filtering circuit and the input terminal of the switch converter;

the first sampling transistor is turned on under the first switching status, and the second sampling transistor is turned on in complementary with the first sampling transistor.

18. The switch converter of claim 14, wherein the first acquisition unit comprises a first sampling transistor, a second sampling transistor, and a first filtering transistor, a first terminal of the first sampling transistor is connected to the second node, the second terminal of the first sampling transistor is connected to the first terminal of the first filtering circuit, and the second terminal of the first filtering circuit is connected to the reference ground;

the first filtering circuit generates the first sampling signal, and the second sampling transistor is connected in parallel with the first filtering circuit;

the first sampling transistor is turned on under the first switching status, and the second sampling transistor is turned on in complementary with the first switch transistor.

19. The switch converter of claim 13, wherein the second acquisition unit comprises a third sampling transistor, a fourth sampling transistor, and a second filtering circuit, a first terminal of the third sampling transistor is connected to the first node, and the second terminal of the third sampling transistor is connected to the first terminal of the second filtering circuit, and the second terminal of the second filtering circuit is connected to the reference ground;

the second filtering circuit generates the second sampling signal, and the fourth sampling transistor is connected in parallel with the second filtering circuit;

the third sampling transistor is turned on under the second switching status, and the fourth sampling transistor is turned on in complementary with the third switch transistor.

20. The switch converter of claim 14, wherein the second acquisition unit comprises a third sampling transistor, a fourth sampling transistor, and a second filtering circuit, the first terminal of the third sampling transistor is connected to the second node, and the second terminal of the third sampling transistor is connected to the first terminal of the second filtering circuit, and the second terminal of the second filtering circuit is connected to the reference ground;

the second filtering circuit generates the second sampling signal, and the fourth sampling transistor is connected between the first terminal of the second filtering circuit and the input terminal of the switch converter;

the third sampling transistor is turned on under the second switch transistor, and the fourth sampling transistor is turned on in complementary with the third switch transistor.

* * * * *